United States Patent [19]
Nishihara et al.

[11] Patent Number: 5,892,629
[45] Date of Patent: Apr. 6, 1999

[54] OBJECTIVE LENS ACTUATOR

[75] Inventors: Yasuo Nishihara; Masatoshi Yajima, both of Osaka, Japan

[73] Assignee: Matsushita Electric Industrial Co.,Ltd., Osaka, Japan

[21] Appl. No.: 931,359

[22] Filed: Sep. 16, 1997

Related U.S. Application Data

[63] Continuation of Ser. No. 530,660, Sep. 20, 1995, abandoned.

[30] Foreign Application Priority Data

| Sep. 20, 1994 | [JP] | Japan | 6-224701 |
| Sep. 20, 1994 | [JP] | Japan | 6-224702 |
| Sep. 20, 1994 | [JP] | Japan | 6-224703 |
| Sep. 20, 1994 | [JP] | Japan | 6-224704 |

[51] Int. Cl.$^6$ .................................................. G02B 7/02
[52] U.S. Cl. ...................... 359/814; 359/824; 369/44.15; 369/247
[58] Field of Search .................... 359/813, 814, 359/823, 824; 369/44.15, 44.16, 247, 248

[56] References Cited

U.S. PATENT DOCUMENTS

| 5,068,844 | 11/1991 | Tanaka | 369/44.16 |
| 5,264,968 | 11/1993 | Masunaga | 359/824 |
| 5,323,369 | 6/1994 | Kim | 369/44.15 |
| 5,446,721 | 8/1995 | Sekimoto et al. | 369/247 |
| 5,521,762 | 5/1996 | Tomiyama et al. | 359/814 |
| 5,523,891 | 6/1996 | Fujisawa | 359/813 |
| 5,535,059 | 7/1996 | Mitsumori et al. | 359/813 |

*Primary Examiner*—Loha Ben
*Attorney, Agent, or Firm*—McDermott, Will & Emery

[57] ABSTRACT

To present an objective actuator small in the number of parts, easy in soldering and assembling, heightened in the motion precision and brake effect, free from undesired resonance due to torsional motion of the objective lens holding member, heightened in the secondary resonance frequency by the torsional motion of the objective lens holding member, and suppressed of its amplitude. A lens holding member holding an objective lens and a housing are simultaneously and integrally molded through four linear spring members inserted in a die. Afterwards, a pair of magnets are fixed on the lens holding member, and an electromagnetic coil is wound, and wire terminals are wound in the wire arrangement grooves, then a soldered coil frame is fixed on the housing. A brake member is injected into the recess space enclosing linear spring members with the inside of the side wall of the housing and the inner wall, the brake frame, its partition wall, and part of the coil frame, from the side surfaces. The objective lens is mounted on the middle and top of the lens holding member holding the objective lens, and an optical plate is fixed in the middle of the lower surface, thereby forming a rigid nearly hexahedral structure, in which the suspension center by the linear spring members and the driving center by the driving system of the electromagnetic coil and magnets are matched, and the moment balance of the lens holding member including the objective lens and optical plate is achieved on this driving center.

33 Claims, 20 Drawing Sheets

B

HOOP MATERIAL

SHOWS WARP DIRECTION TO FIXING POINT OF WIRE FRONT END

FIXING POINT

FIG. 7(a)  FIG. 7(b)  FIG. 7(c)
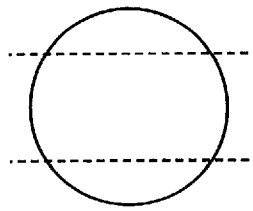 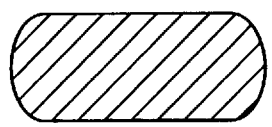 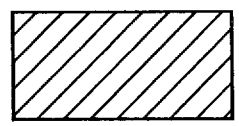
FIG. 7(d)
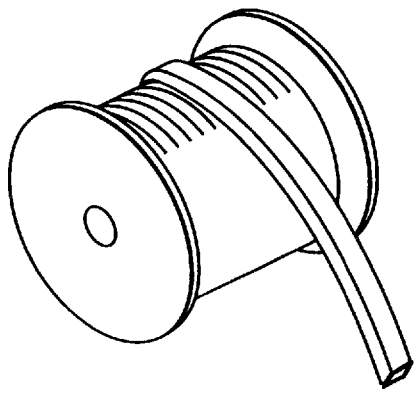
FIG. 7(e)  FIG. 7(f)
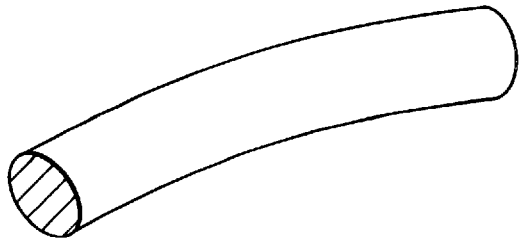 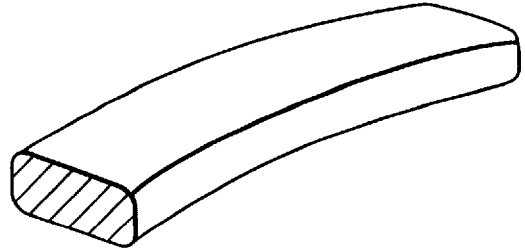

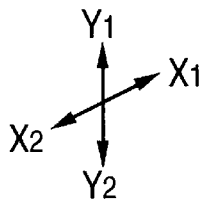
FIG. 13
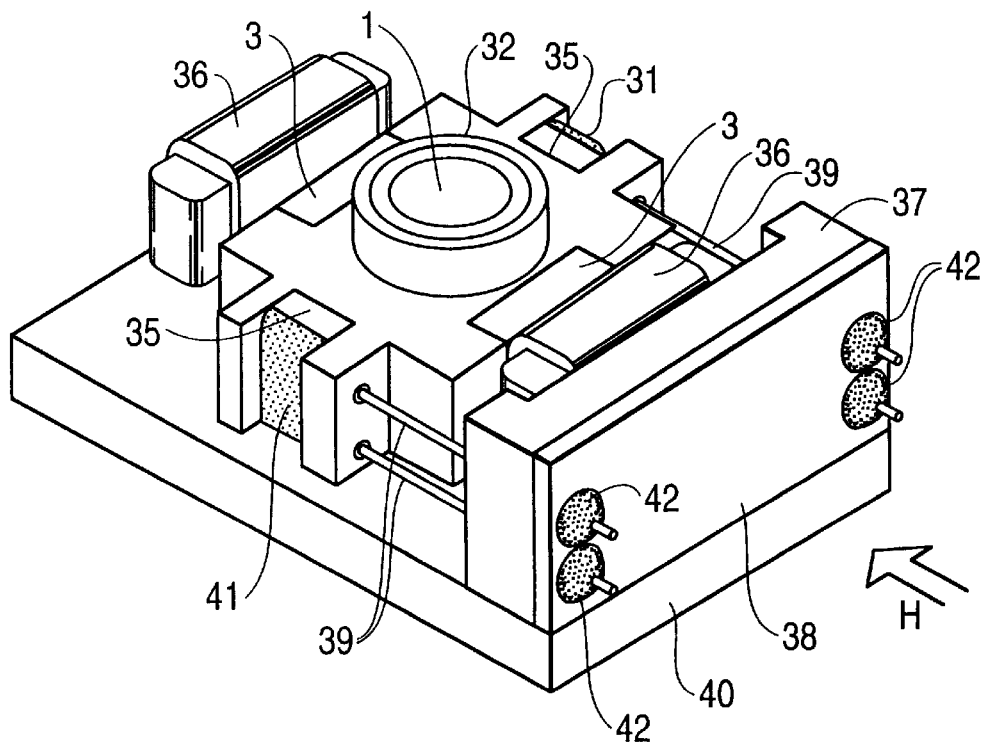
FIG. 15
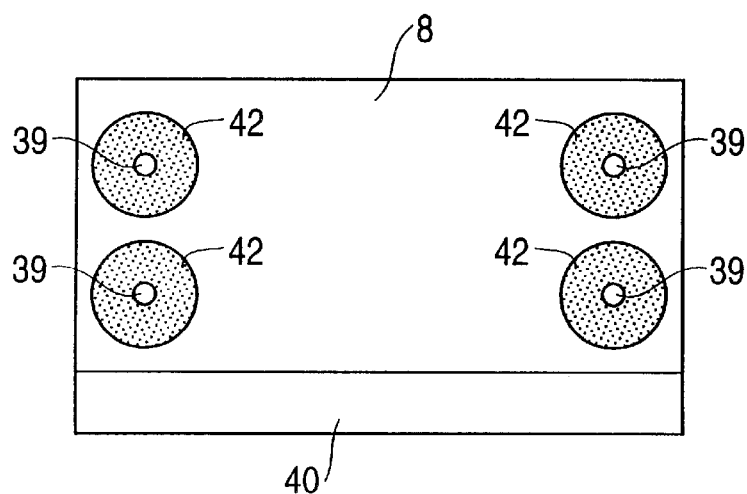

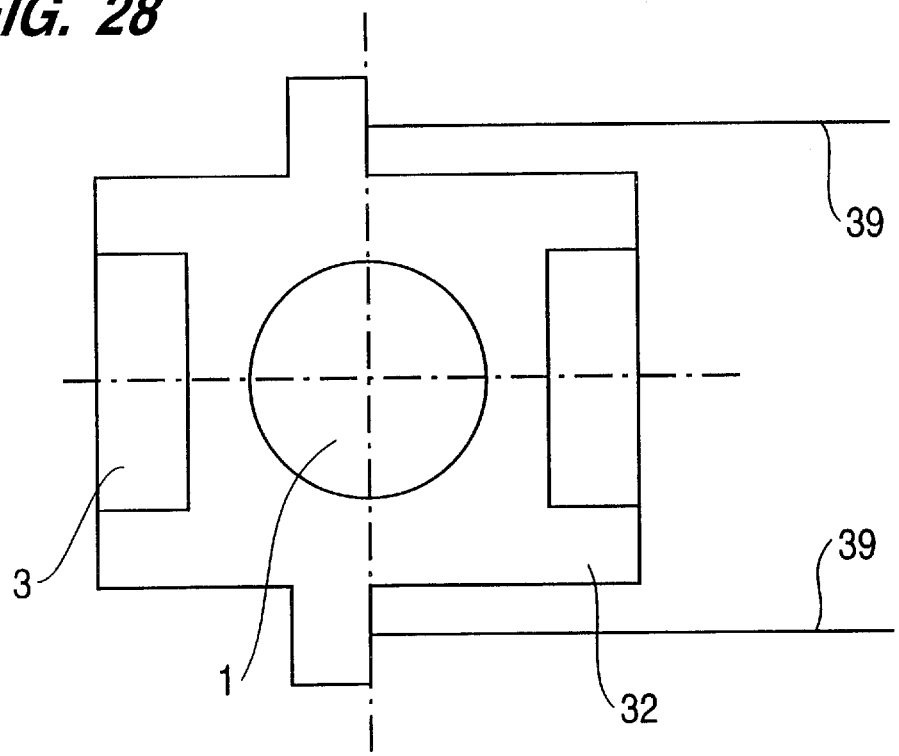

OBJECTIVE LENS ACTUATOR

This is a File Wrapper Continuation application of application Ser. No. 08/530,660 filed Sep. 20, 1995 now abandoned.

BACKGROUND OF THE INVENTION

1. Field of the Invention

The present invention relates to an objective lens actuator for recording or reproducing optically in a disk-shaped recording and reproducing medium.

2. Prior Art

Recently, the apparatus for recording and reproducing information (called an optical disk apparatus) by using a disk-shaped optical recording and reproducing media (called a disk) is widely used in recording of sound, picture, and data as its benefits of large capacity and high speed operation are recognized. Among the components incorporated in the optical disk apparatus, the objective lens actuator is regarded as an important mechanical part that determines the recording and reproducing performance.

A conventional objective lens actuator is described below while referring to related drawings. FIG. 13 is a perspective outline view of a conventional objective lens actuator, FIG. 14 is a perspective exploded view of the objective lens actuator, and FIG. 23 is a partial sectional view showing a mounting part of an electromagnetic coil of the same. This example shows an objective lens actuator using four linear spring members for holding a lens holding member, and is widely used at the present.

In FIG. 13 and FIG. 14, in a lens holding member 32, an objective lens 1 is adhered to the upper surface in the drawing, a balance weight 34 is adhered to the lower surface, soldering substrates 35 for soldering and fixing front ends of linear spring members 39 are adhered to both sides, and two magnets 3 magnetized in the N-S direction are adhered to the other sides as shown in the drawing. At one end on a base 40, a support holder 37 is fixed, and soldering substrate 38 for soldering the other ends of the linear spring members 39 are adhered to the support holder 37. The linear spring members 39 have been cut to specified length, and four members are arranged parallel through a tiny hole 43 of the soldering substrate 38 made of printed circuit board, a tiny hole 44 of the support holder 37, and a tiny hole 45 of the lens holding member 32, and the both ends are soldered at soldering parts 41 and 42 in the drawing in the soldering substrate 35 fixed to the lens holding member 32 and the soldering substrate 38 fixed to the support holder 37.

Oppositely across a clearance to the magnets 3, electromagnetic coils 36 for driving them electromagnetically are fixed at specified positions similarly on the base 40 through printed circuit boards 47 as shown in FIG. 23, and more specifically a winding 36b having an axis in arrow X1-X2, and a winding 36c having an axis in arrow Y1-Y2 are wound around a coil frame 36a, and leaders of beginning and end of these windings are wound around roots 36e of metal pins 36d planted on the coil frame 36a, and are soldered 36f. The pins 36d of this coil frame 36a are inserted into four holes 47a of the printed circuit board 47, and are fixed by soldering 47c, and are electrically connected to the print pattern. Mounting holes 47b of the printed circuit board 47 are fastened with screws to screw holes 40a of the base 40 as shown in FIG. 14 through spacers 48, and are drawn out by lead wires, not shown, soldered to the print pattern, and are connected to an electric circuit which is not shown. From above this assembly, a cover 46 having an opening 46a is put on the base 40 through a hook part 46b.

Referring now to FIG. 19, the structure of the root for supporting the four linear spring members 39 of the support holders 37 in FIG. 13 is explained. The peripheral parts not related with the description are not shown in the drawing. In FIG. 19, seeing the support holder 37 from the lens holding member 32 side, four holes 37d are formed in the root for supporting the linear spring members 39, and a viscoelastic material, such as silicone gel, is injected into the holes 37d as brake members 37e.

In thus constituted conventional objective lens actuator, the operation is described below. By the linear spring members 39 disposed parallel to each other, the lens holding member 32 is supported at one side on the support holder 37, so that the lens holding member 32 can be moved parallel in the direction of arrow X1-X2 and arrow Y1-Y2. When a current is passed in two windings having the axis in arrow X1-X2 of the electromagnetic coil 36 and axis in arrow Y1-Y2, a driving force in the directions of arrow X1-X2 and arrow Y1-Y2 is generated in the magnets 3 by the electromagnetic force generated between the magnets 3 magnetized in the N-S direction oppositely across a clearance, thereby driving the lens holding member 32, hence the objective lens 1 fixed thereon, in the directions of arrow X1-X2 and Y1-Y2.

Accordingly, through the objective lens 1, the focal point of the laser light focused on a disk, not shown, above the objective lens can be moved, and information signals are recorded or reproduced, following the runout in the disk surface and eccentricity in the radial direction.

Supposing to pass a constant current regardless of the frequency to the winding having an axis in arrow X1-X2 of the electromagnetic coil 36, the state of the lens holding member 32 supported by one side on the linear spring members 39 by the electromagnetic force acting between the magnetic field generated by this current and the magnets 3 in the direction of arrow X1-X2 is shown in the lens system driving frequency characteristic in FIG. 18 in which the axis of abscissas denotes the frequency (Hz) of the driving current of the electromagnetic coil 36 and the axis of ordinates is the lens amplitude (dB). In the diagram, a primary resonance point f1 appears usually around scores of hertz (about 30 to 50 Hz). If the vibration system balance is poor and the linear spring members 39 are distorted, a torsional vibration on the axis of the linear spring members 39 is caused in the lens holding member 32, and an unnecessary resonance appears around a double frequency, slightly above f1, as indicated by broken line, in FIG. 18. The primary resonance is attenuated usually by braking the linear spring members 39. As an example of this method, as shown in FIG. 19, a brake member composed of viscoelastic material is injected into the peripheral holes 37d of the linear sprig members 39 of the fixed supporting holder 37 of the linear spring members 39, or, although not shown, a tube made of viscoelastic material is put around the linear spring members 39, but these measures are not effective to suppress the undesired resonance or secondary resonance point f2 appearing at higher frequency.

Problems that the Invention Is to Solve

In such conventional constitution, in the lens system driving frequency characteristic diagram in FIG. 18, the amplitude of the primary resonance point f1 can be suppressed to a certain extent, but the undesired resonance slightly above f1 cannot be prevented unless the holding center of the four linear spring members 39 and the center of gravity of the lens holding member 32 to be held are matched in this case. It can be suppressed by using a balance weight 34 in FIG. 14 so as to match them, but addition of unnecessary weight causes to worsen the driving characteristic of the lens system, and yet secondary resonance cannot be suppressed by this measure. The secondary resonance occurs due to the deflection in the vertically shifting direction of the right and left ends in the drawing as indicated by broken line by the lens holding member 32 by the driving forces F1, F2 of the electromagnetic coil 36 with respect to the center in the drawing when the vibration frequency becomes higher in FIG. 20 showing an essential plan of the lens holding member 32 in FIG. 13, and this resonance frequency is desired to be 50 kHz or more, but when the condition is poor, it may decline below about 15 kHz, thereby causing the problem of elevation of the top of the characteristic curve.

Incidentally, in the conventional constitution, in order to maintain the precision of the parallel motion of the lens holding member 32, the diameter of the tiny hole 45 of the lens holding member 32 for penetrating the linear spring members 39 and the tiny hole 44 of the support holder 37 must be equal to the diameter of the linear spring members 39 as far as possible, and hence insertion of the linear spring members 39 is very difficult, and also soldering for fixing the both ends is difficult from the viewpoint of the strength and control of the junction length, which presented assembling problems.

Also in this constitution and manufacturing method, the linear spring members 39 are likely to be deformed permanently, and the position precision of the objective lens 1 is not achieved, and it involves performance problems such as difficulty in parallel move of the objective lens.

Moreover, as shown in FIG. 23, the lead wires of the windings 36b, 36c of the electromagnetic coil 36 are wound and soldered on the pins 36d of the coil frame 36a, and the pin 36d are further passed through the hole 47a of the printed circuit board 47 and soldered, and further by fixing the printed circuit board 47 to the base 40, the lead wires must be drawn out by soldering, and hence there were many soldering points and soldering defects were likely to occur.

Yet, since the coil frame 36a is once soldered to the printed circuit board 47, and this printed circuit board 47 is mounted on the base 40, and hence there are many points possibly causing position errors, and it was needed to determine the positioning in the final place.

In addition, there are many parts, and many difficult jobs, such as the job of winding the lead wire around the pin 36d, and the job of passing the pin 36d of the coil frame 36a into the hole 47a of the printed circuit board 47, and hence the production cost is raised.

Besides, in the conventional constitution, by the signal current given to two windings of the electromagnetic coil 36, a driving force is generated in the direction of arrow X1-X2 and Y1-Y2 in the magnets 3 by the electromagnetic force generated between the confronting separated magnets 3, thereby driving the lens holding member 32 and the objective lens 1 fixed thereto in the direction of arrow X1-X2, Y1-Y2, but the lens holding member 32 supported on one side by the linear spring member 39 has a certain primary resonance point as known widely, and if resonance at this resonance point is great, it is difficult to drive the objective lens actuator. As a method for suppressing low the primary resonance phenomenon, it is attempted to brake by using a viscoelastic brake member as shown in FIG. 19, but as known from FIG. 19, small four holes 37d must be processed individually, and it is a difficult job to inject the viscoelastic material uniformly as the brake member 37e around the periphery of the linear spring members 39 of the four holes 37d, and the productivity was low.

SUMMARY OF THE INVENTION

To solve the problems in the prior art, it is an object of the invention to present an objective lens actuator which is small in the number of parts, small in the number of soldering points, easy to position and easy to assemble, excellent in productivity, and capable of preventing occurrence of undesired resonance accompanying primary resonance, moving the secondary resonance point to the higher frequency as far as possible, and increasing the control gain.

Means of Solving the Problems

To achieve the above object, the invention presents an objective lens actuator comprising a lens holding member for holding an objective lens, plural linear spring members for supporting the lens holding member, and a fixing member for fixing the linear spring members, wherein the lens holding member, linear spring members and fixing member are integrally formed by mold forming.

Or, instead of mold forming, the constitution may also comprise a lens holding member divided into a plurality for holding the objective lens, plural linear spring members for supporting the lens holding members, and a fixing member divided into a plurality for fixing the linear spring members, wherein the linear spring members are held and fixed and formed into one body by the plurality of lens holding members and the plurality of fixing members.

The linear spring members are disposed on two upper and lower parallel lines spaced oppositely, and the spring members confronting mutually above and below, right and left, or diagonally are arranged so that the curvature direction caused inevitably due to material manufacturer may be in reverse direction.

Besides, as required, a protruding shape, a recess shape or a rough surface may be formed either in the entire surface of the linear spring members or in the sealing portion of the lens holding members or fixing members, and the linear spring members are composed to have two mutually parallel planes.

To achieve the object, moreover, the manufacturing method of the objective lens actuator of the invention comprises the steps of forming frame-shaped fixing member for fixing plural linear spring members at two points respectively and lens holding members not contacting with the fixing members in the frame of the fixing members, and cutting off all of one side of the lens holding members of the linear spring members and fixing members thereafter or after assembling necessary accessories, thereby supporting the lens holding members at one side.

Still more, the frame-shaped fixing members for fixing continuous plural linear spring members at two points, and the lens holding members not contacting with the fixing members in the frame of the fixing members may be formed consecutively, and in this method, hence, the lens holding member and fixing members can be formed by mold forming.

In this constitution and manufacturing method, the objective lens actuator of the invention is enhanced in the mounting precision of the lens holding members mounted on the frame-shaped fixing member through linear spring members, so that the mounting strength can be increased. In addition, by the definition of the linear spring members in the curvature direction, effects of curvature of the linear spring members are less, and the position of the lens holding members and hence the objective lens being held by them is stable, so that the motion precision is enhanced.

According to the manufacturing method of the objective lens actuator of the invention, fixing work of the linear springs for keeping the parallel motion of the lens holding members is easy, and the mounting precision and manufacturing efficiency can be enhanced.

To achieve the object, moreover, the objective lens actuator of the invention essentially comprises a lens holding member of a nearly hexahedral shape for holding the objective lens, an objective lens mounted on a first plane of ths lens holding member, an optical plate mounted on a second plane confronting the first plane of the lens holding member, and a pair of driving magnets or a pair of driving electromagnetic coils mounted on a third plane between the first plane and second plane of the lens holding member and a fourth plane confronting the third plane, further comprising, in addition to this constitution, plural linear spring members perpendicular to the third and fourth planes for supporting the lens holding member at one side, being fixed at one end each.

In this constitution, in the center of the driving force by the pair of driving magnets and a pair of driving electromagnetic coils, it is arranged so that the moment of the objective lens and the moment of the optical plate may be equal, and if necessary, this condition may be sufficed by adding a weight to the side smaller in moment.

In other constitution, the lens holding member of the objective lens actuator excluding the objective lens, optical plate, and the additional weight added by necessity is equal to the center of the driving force by the pair of driving magnets or pair of driving electromagnetic coils, and the holding center by the linear spring members and the driving center by the pair of driving magnets and pair of driving electromagnetic coils are matched.

In the objective lens actuator of the invention, in the above constitution, the lens holding member is integrated with the optical plate together with the objective lens to form a rigid nearly hexahedral box shape, and the holding center in the vertical direction of the lens holding member held by the plural linear spring members and the center of the driving force created by the electromagnetic coil and magnet are matched, and moreover since the moment or the product of the mass of the objective lens and the distance to the center of driving, and the moment or the product of the mass of the optical plate or the additional weight added thereby by necessity and the distance to the center of driving are equal to each other, undesired resonance is suppressed without distorting the lens holding members, and the rigidity is enhanced by the right structure of nearly hexahedral form, and therefore the objective lens holding members are rarely deflected, the amplitude is decreased while enhancing the secondary resonance frequency, the control gain is heightened, and a negative feed back comprehensively combining the electric and mechanical system can be forcefully applied, so that it is possible to act to follow up if there is any motion not preferable for the disk.

To achieve the object, still more, the objective lens actuator of the invention comprises a winding part for winding two orthogonal coils in the axial direction by overlaying, a covering part linked to the winding part for covering the inside, plural wire arrangement grooves provided in the covering part for winding the leading wires of the start and end of winding of the coil, and a coil frame having a solder processing part provided in the lead wires wound in the wire arrangement grooves in part of the wire arrangement grooves, wherein the solder processing part may be disposed either at the end of the covering part or on the flat part of the covering part.

In the solder processing part, the depth of the wire arrangement grooves may be partially made shallow, and the coil frame, if made of synthetic resin material, is formed of a heat resisting material over the solder melting temperature so as to withstand soldering. In the solder processing part, a flexible printed circuit board having a corresponding conductive foil is fitted and soldered.

To achieve other object, the constitution comprises a lens holding member for holding an objective lens, plural linear spring members for supporting the lens holding member, a fixing member for fixing the linear spring members, and a coil frame consecutive to a winding part for winding two coils differing in axial direction by overlaying and having a positioning fixing part corresponding to the fixing member, and this lens holding member has a pair of magnets fixed by adhesion or mold forming. The coil frame can have a protrusion or extending part for defining the movable range of the lens holding member, and a nearly box-shaped structure can be formed by the coil frame having the expanding part, frame-shaped fixing member, and lens holding part.

In the objective lens actuator of the invention, having such constitution, the lead wires at the start and end of winding of the coil wound on the winding part are wound around the wire arrangement groove of the covering part of the coil frame, and soldered in the solder processing part at part or end of the wire arrangement groove, and a flexible printed circuit board having a conductive foil corresponding to the solder processing part can be fitted and soldered.

This solder processing part may be formed not only at the end of the covering part, but also on a flat part of the covering part, and in the constitution partially shallow in the depth of the wire treatment grooves in the solder processing part, the soldering part builds up on the surface, and the soldering is more secure, or when forming the coil frame by a synthetic resin material, by using a material having a heat resistance over the solder fusion temperature, the shape is not deformed by soldering.

According to this constitution, the lens holding member for holding the objective lens is supported by plural linear spring members, and the coil frame is easily positioned by the positioning fixing part with respect to the fixing member for fixing the linear spring member, and large positioning deviation due to accumulating of mounting errors does not occur.

Besides, the coil frame can be defined in the movable range so that the lens holding member may not deflect excessively by the protrusion or expanding part, and a nearly box-shaped form is achieved by the coil frame having the expanding part, frame-shaped fixing member, and lens holding part, so that dust or foreign matter can hardly get inside enclosed by these parts.

To achieve the object, the objective lens actuator of the invention also comprises, as a first constitution, a lens holding member for holding the objective lens, a plurality of linear spring members for supporting the lens holding member, a fixing member for fixing the linear spring members at one side, and a casing forming one recess for enclosing the fixing parts of the plurality of linear spring members in batch in the fixing member and sealing a viscoelastic material inside thereof in batch.

In this constitution, an enlarged sectional part can be provided partially in the sealing portion of the linear spring in the viscoelastic material.

A further different constitution may comprise a lens holding member for holding an objective lens, plural first linear spring members planted on a first plane of protrusion for fixing the linear spring of the lens holding member, a linear fixing member for fixing the other ends of the plural first linear spring members on one side on the first plane, plural second linear spring members planted on a second plane on opposite to the first plane of the lens holding member, plural third linear spring members having a confronting part with a small spacing to the plural second linear spring members, with the other ends planted on the opposite plane of the first plane of the fixing member, and a viscoelastic member formed including the confronting parts of the second linear springs and third linear springs, in which the first and second linear spring members are formed integrally.

The objective lens actuator of the invention in such constitution acts to enhance the brake effect by the enlarged section provided partially in the sealing portion of the linear springs in the viscoelastic material.

Since plural linear spring members are planted in one recess, and the viscoelastic material is injected in batch, so that the brake member can be injected easily.

In the constitution having the viscoelastic material formed by including the confronting parts of the second linear springs and third linear springs, the brake member can be formed easily.

BRIEF DESCRIPTION OF THE DRAWINGS

FIG. 5 shows sectional views of a die for forming the part shown in FIG. 3 by injection molding, in which:

Figure 3:
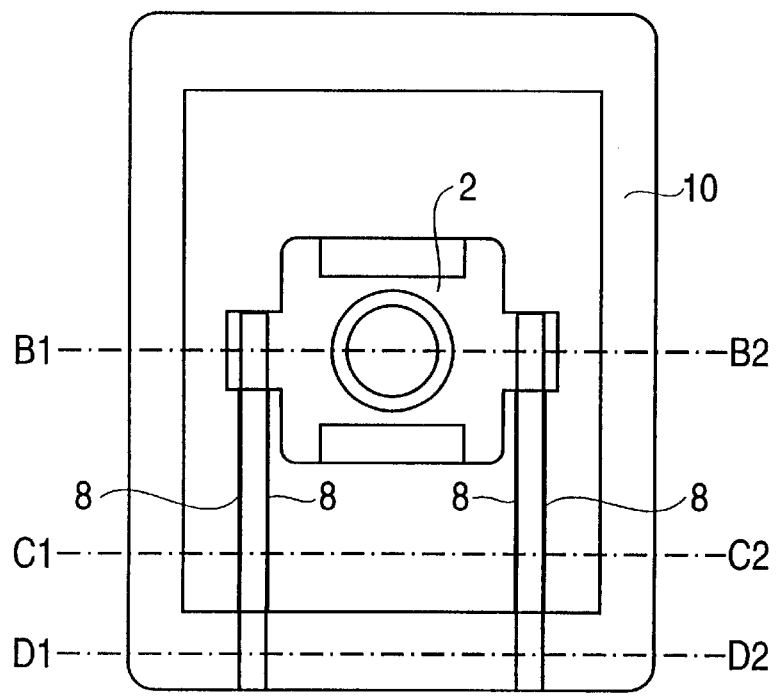
FIG. 3 is a plan view showing a lens holding member 2 cantilevered by a linear spring member 8 in a housing 10.
Figure 3:
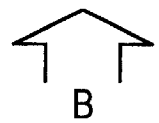

(a) section B1-B2 in FIG. 3;

(b) section C1-C2 in FIG. 3; and (c) section D1-D2 in FIG. 3.

FIG. 6 shows explanatory diagrams of the means for solving bending of linear spring members, in which:

(a) a perspective view of a hoop material as a material of linear spring member;

(b) an explanatory diagram showing curvature of linear spring member;

(c) a perspective view of assembled state of actuator;

(d) a view from arrow F in (c); and (e) to (j) explanatory diagrams of combination of curvature direction of four linear spring members.

FIG. 7 shows processing explanatory diagrams of linear spring member material, in which:

(a) a rolling explanatory diagram in vertical direction;

(b), (c) sectional views of linear spring member material;

(d) a perspective view of processed hoop material wound on a reel;

(e) a perspective view of material before processing; and (f) a perspective view of material after processing.

FIGS. 8(a) to (d) are processing explanatory diagrams for preventing from slipping out of linear spring member material.

FIG. 9 shows explanatory diagrams of other embodiment for forming brake member of linear spring member, in which:

(a) a perspective view showing a formed brake member; and (b) a sectional view showing a die structure in section G1-G2 in (a).

Figure 10:
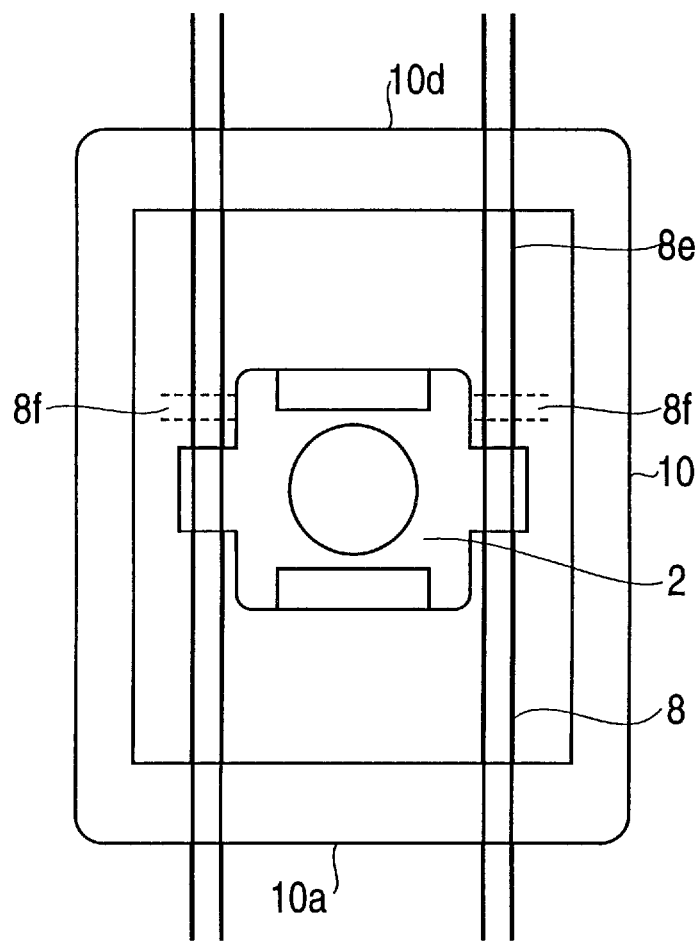

FIG. 10 is a plan view showing assembled state of housing and lens holding member through linear spring member.

Figure 11:
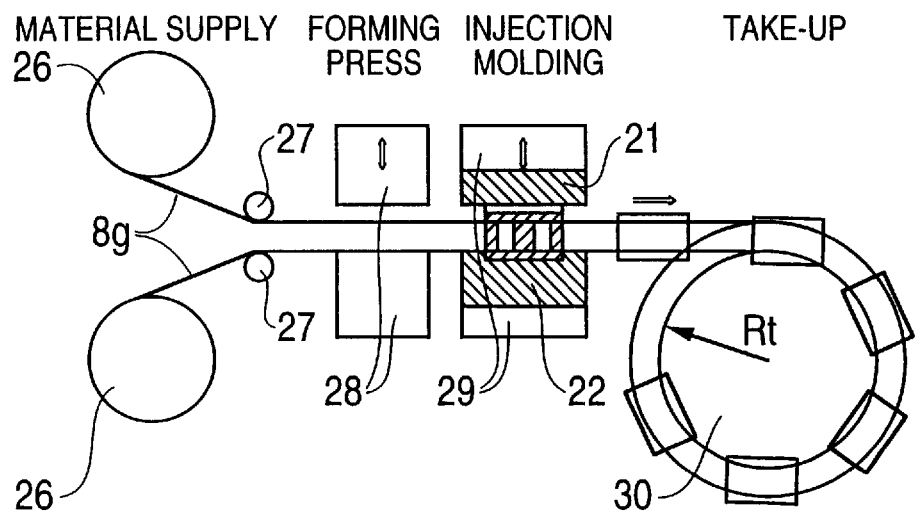

FIG. 11 is an explanatory diagram showing continuous forming process in a manufacturing method of the invention.

Figures 12A, 12B:
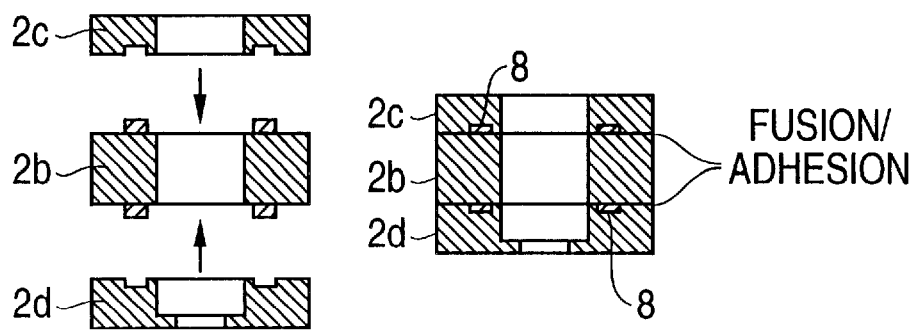

FIG. 12(a) is an explanatory diagram showing an example of other assembling method of the invention.

FIG. 12(b) is a sectional view of the assembled state thereof.

FIG. 13 is a perspective outline view of an objective lens actuator in prior art.

Figure 14:
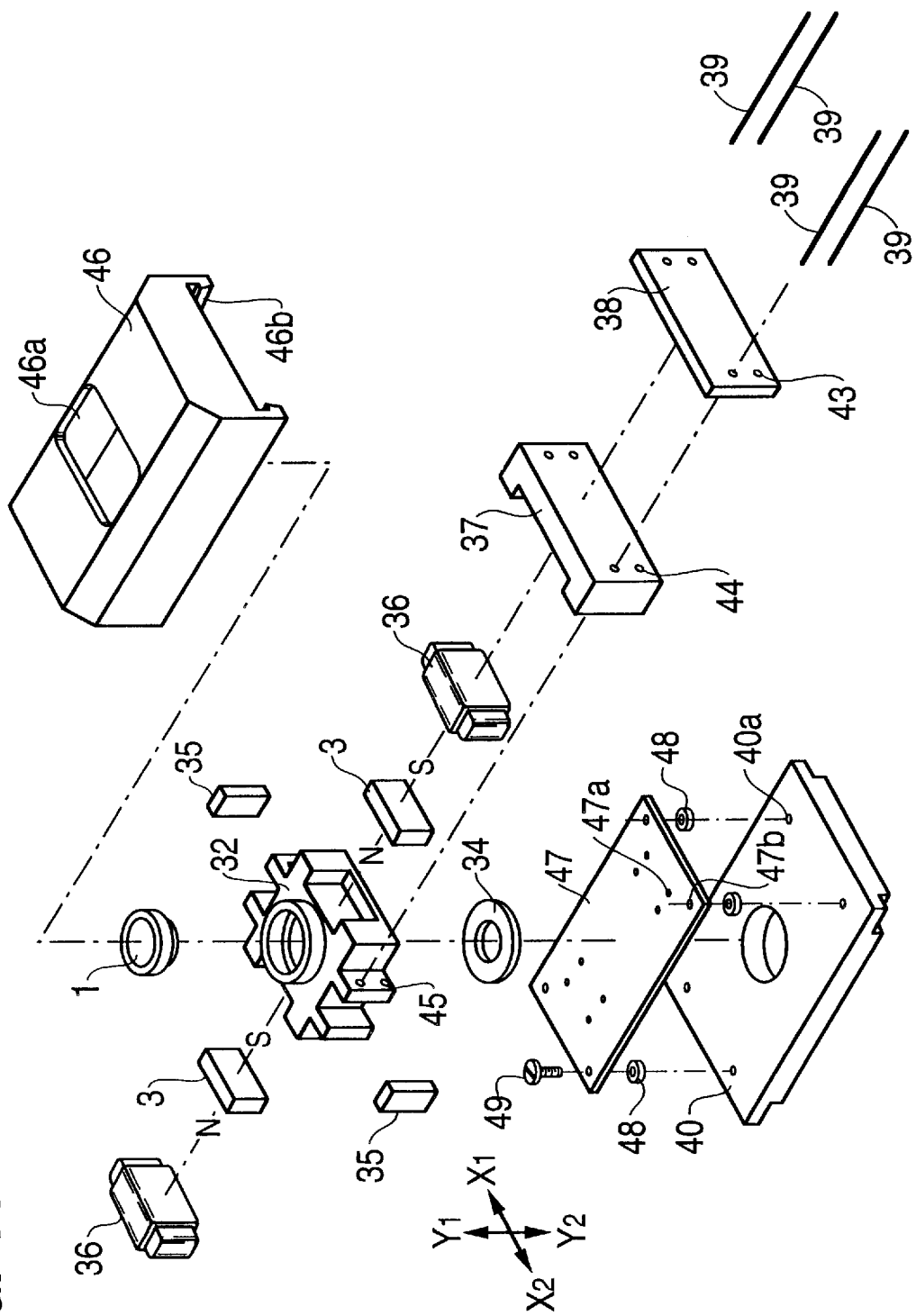

FIG. 14 is a perspective exploded view of the same objective lens actuator.

FIG. 15 is a view from arrow H in FIG. 13.

Figure 16:
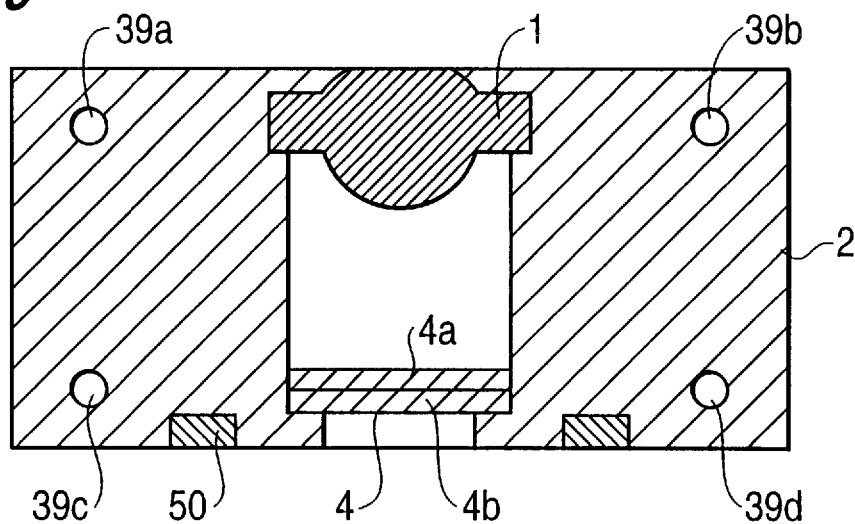

FIG. 16 is a partial sectional view of an objective lens actuator in an embodiment of the invention.

Figure 17:
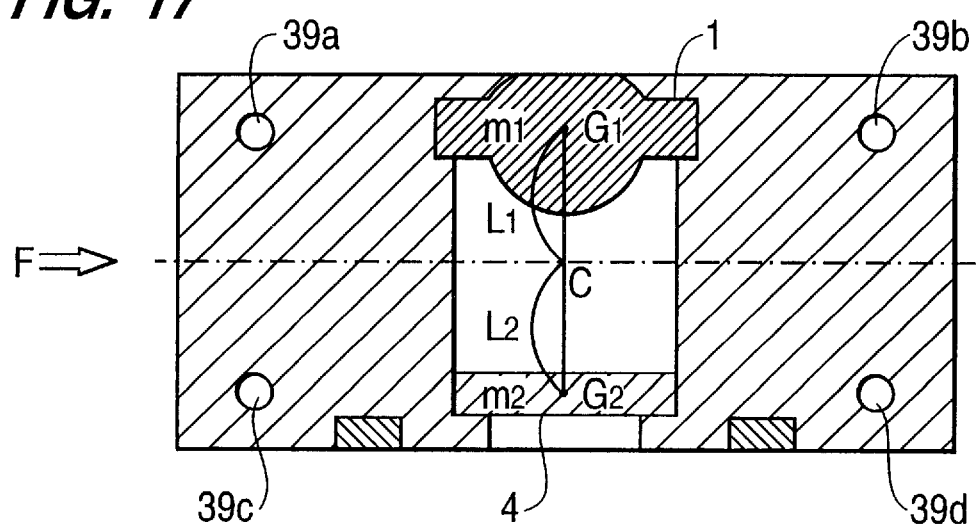

FIG. 17 is an explanatory diagram showing moment balance of the objective lens actuator.

Figure 18:
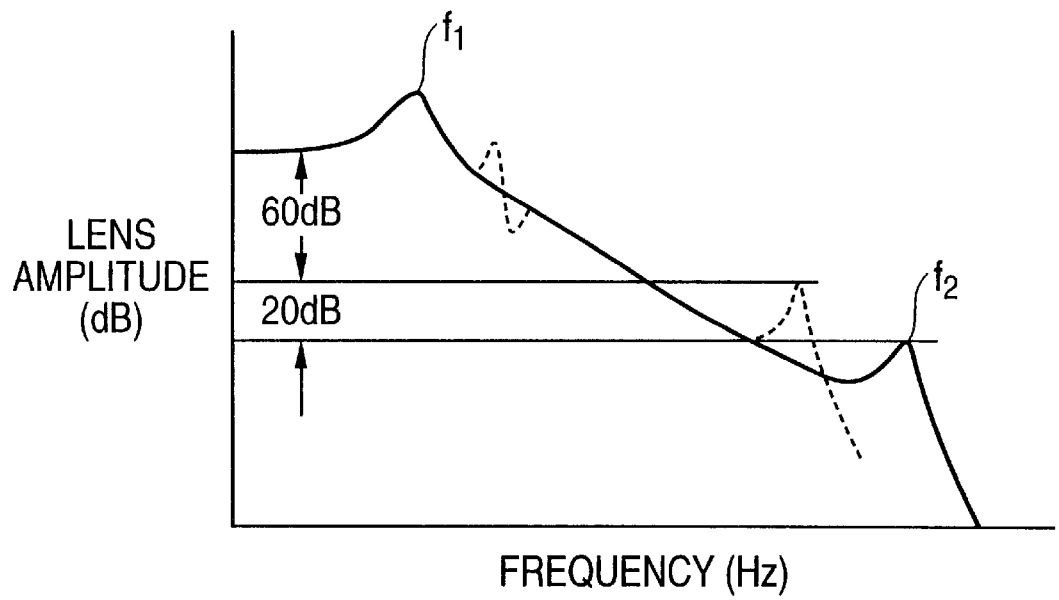

FIG. 18 is a driving frequency characteristic diagram of lens system of the objective lens actuator.

Figure 19:
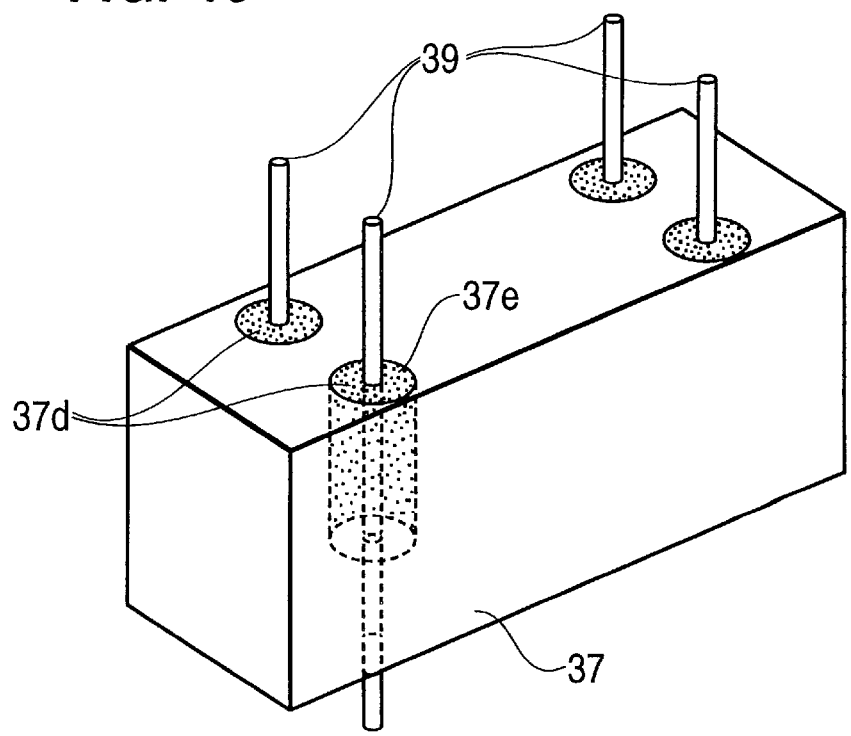

FIG. 19 is a partial perspective view of brake unit in an objective lens actuator in prior art.

Figure 20:
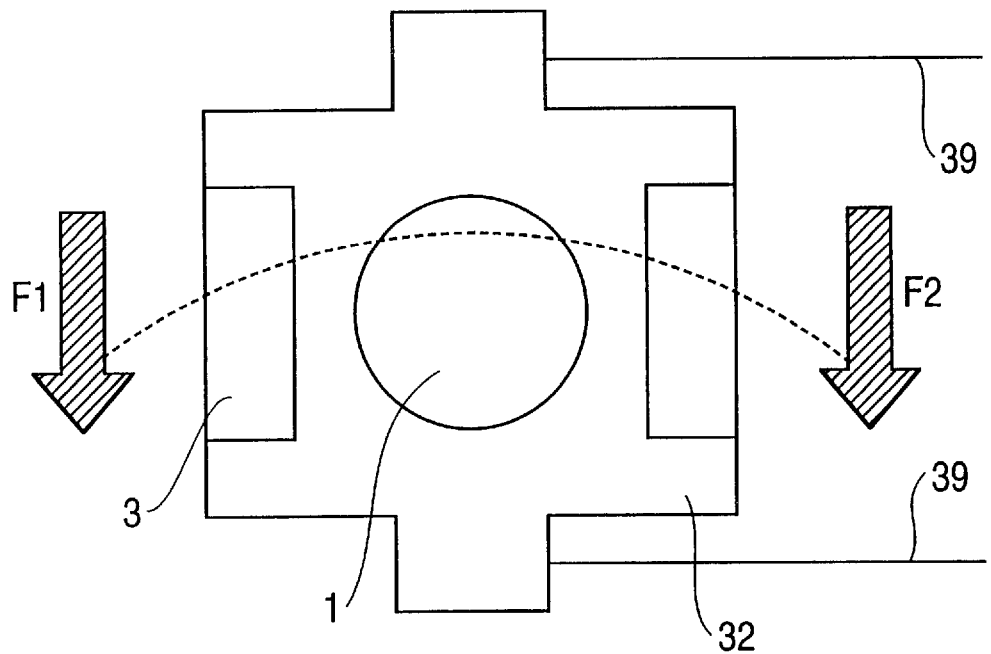

FIG. 20 is a partial plan view of the same objective lens actuator.

Figure 21:
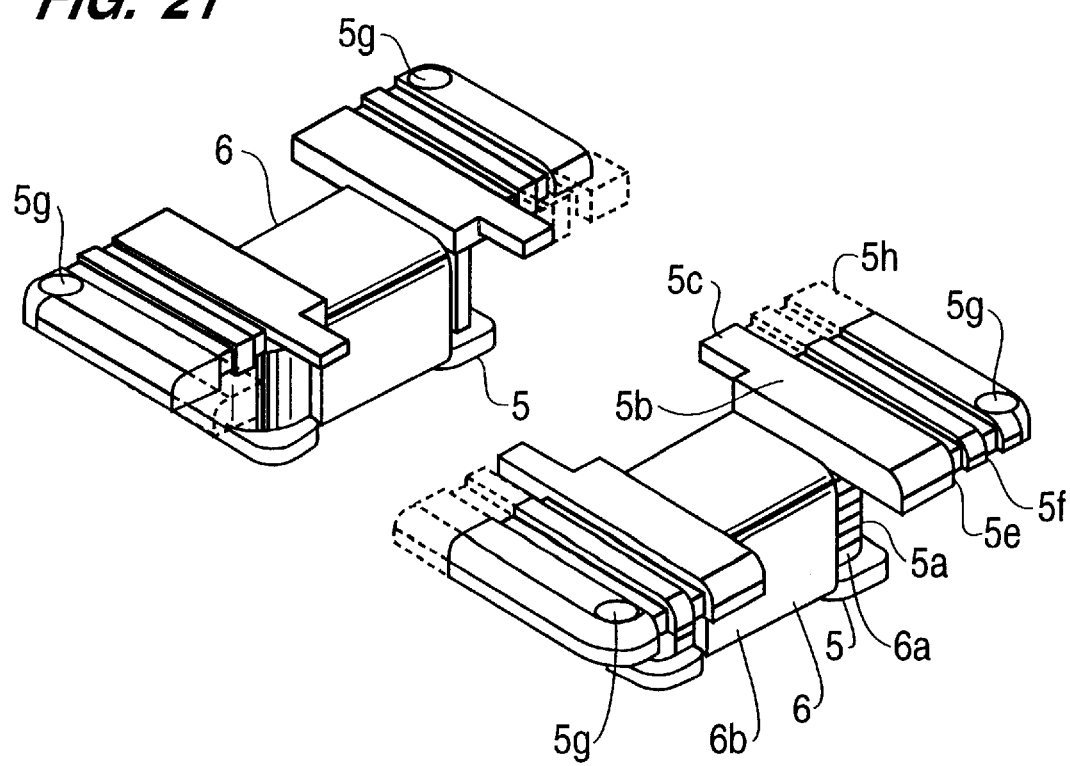

FIG. 21 is a magnified perspective view of a coil frame of the invention.

Figure 22A:
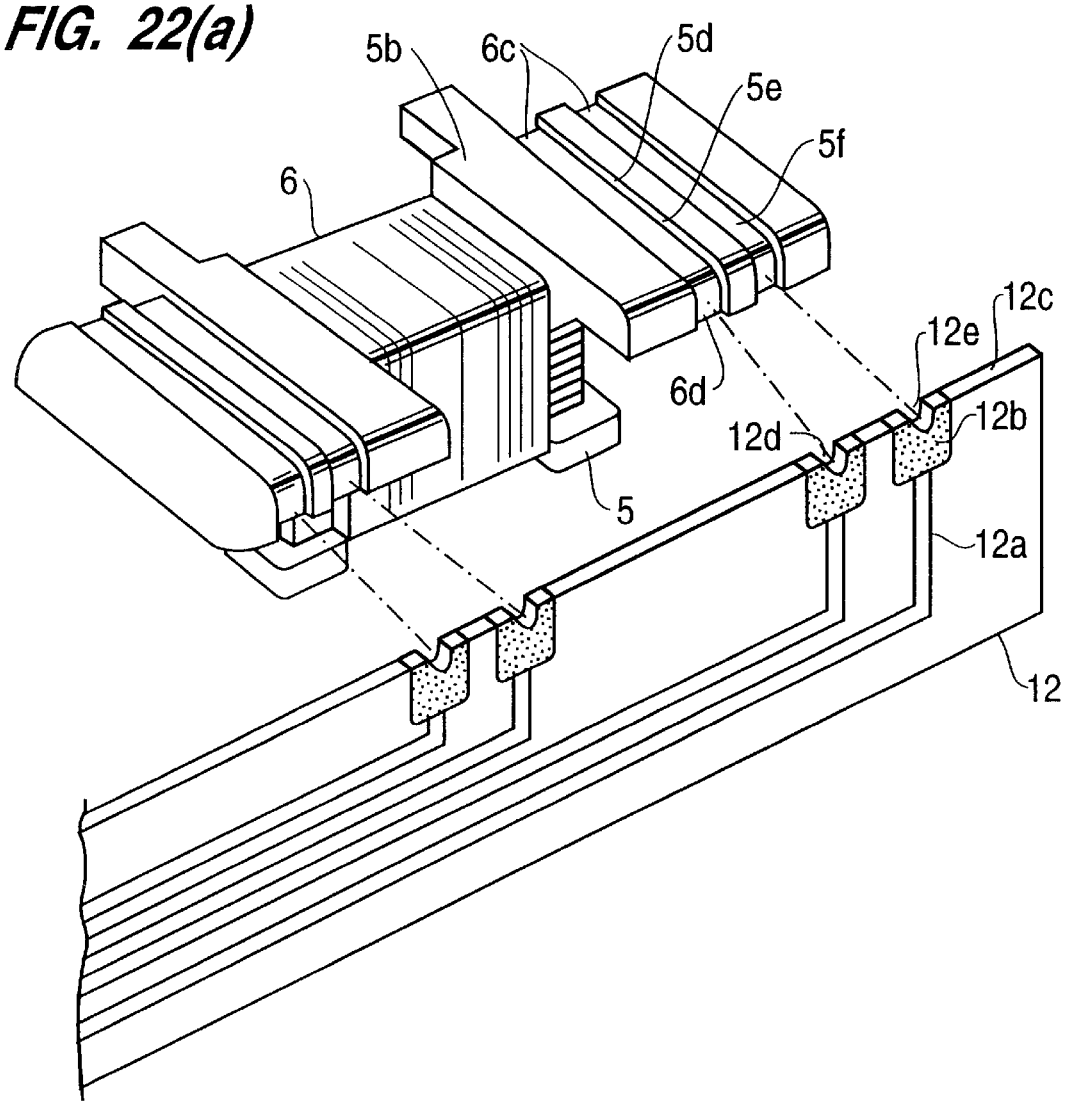

FIG. 22(a) is a perspective assembly view showing an electric connecting method to the coil frame.

Figure 22B:
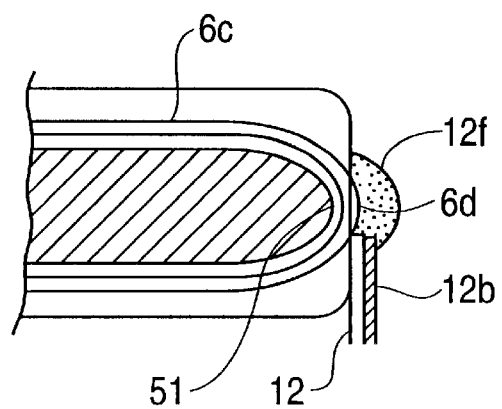

FIG. 22(b) is a sectional view showing other electric connecting method to the coil frame.

Figure 23:
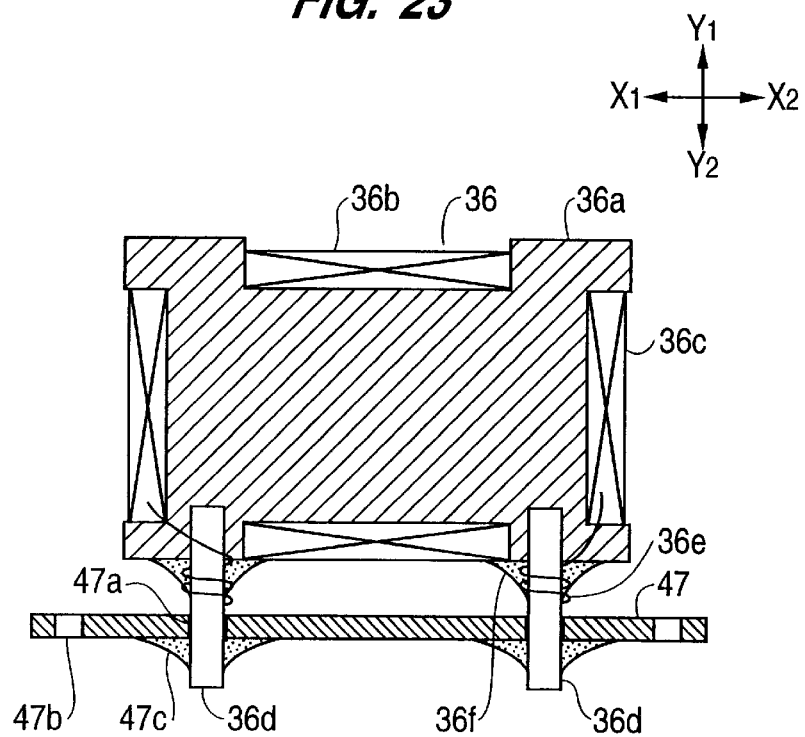

FIG. 23 is a partial sectional view showing mounting part of electromagnetic coil in prior art.

Figure 24:
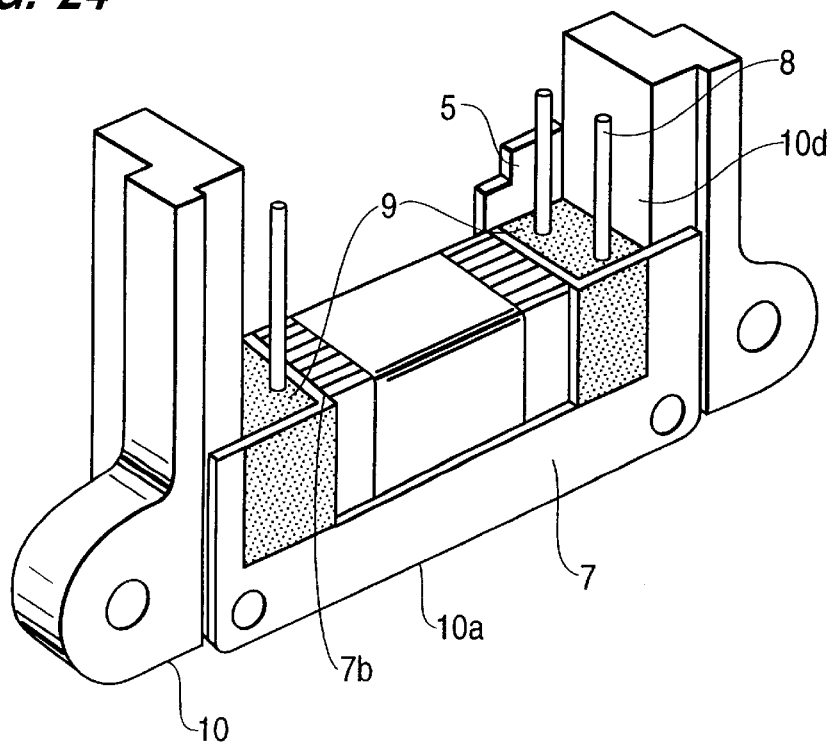

FIG. 24 is a partial perspective view of brake unit of the invention.

Figure 25:
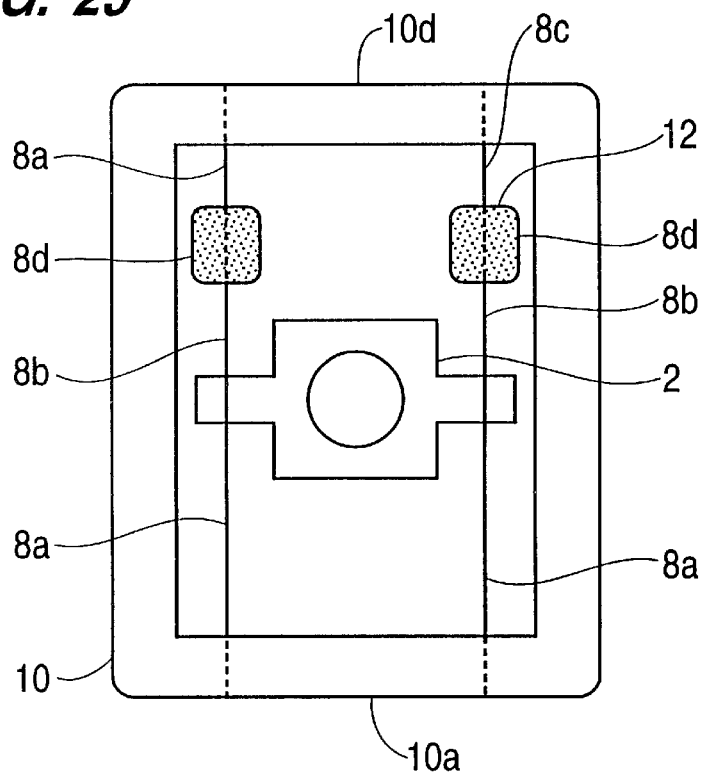

FIG. 25 is a partial plan view in a second embodiment of the brake unit.

Figure 26:
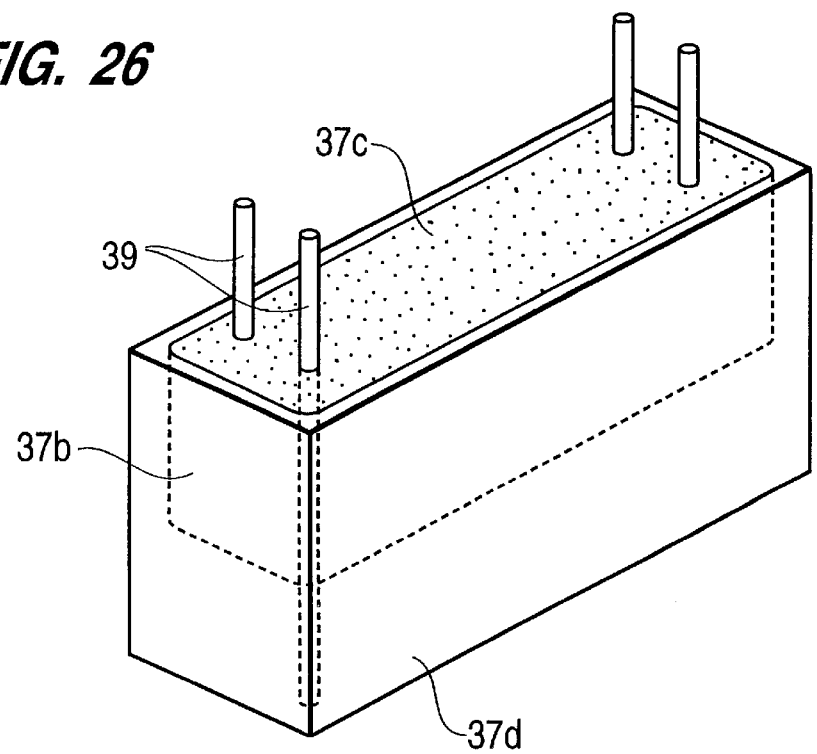

FIG. 26 is a partial perspective view in a third embodiment of the brake unit.

Figure 27A:
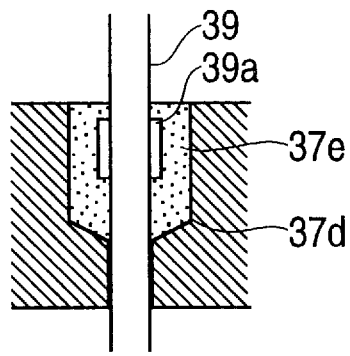

FIG. 27(a) is a partial sectional view of a fourth embodiment of the brake unit.

Figure 27B:
Figure 27C:
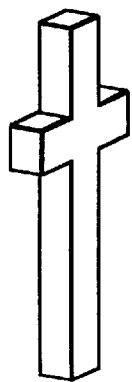
Figure 27D:
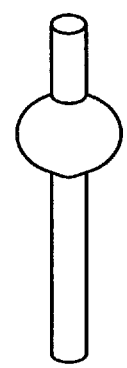

FIGS. 27(b) to (d) are processing diagrams of linear spring members in the fourth embodiment.

FIG. 28 is a partial plan view showing holding position of lens holding member by the linear spring members.

DETAILED DESCRIPTION OF THE INVENTION

Figure 1:
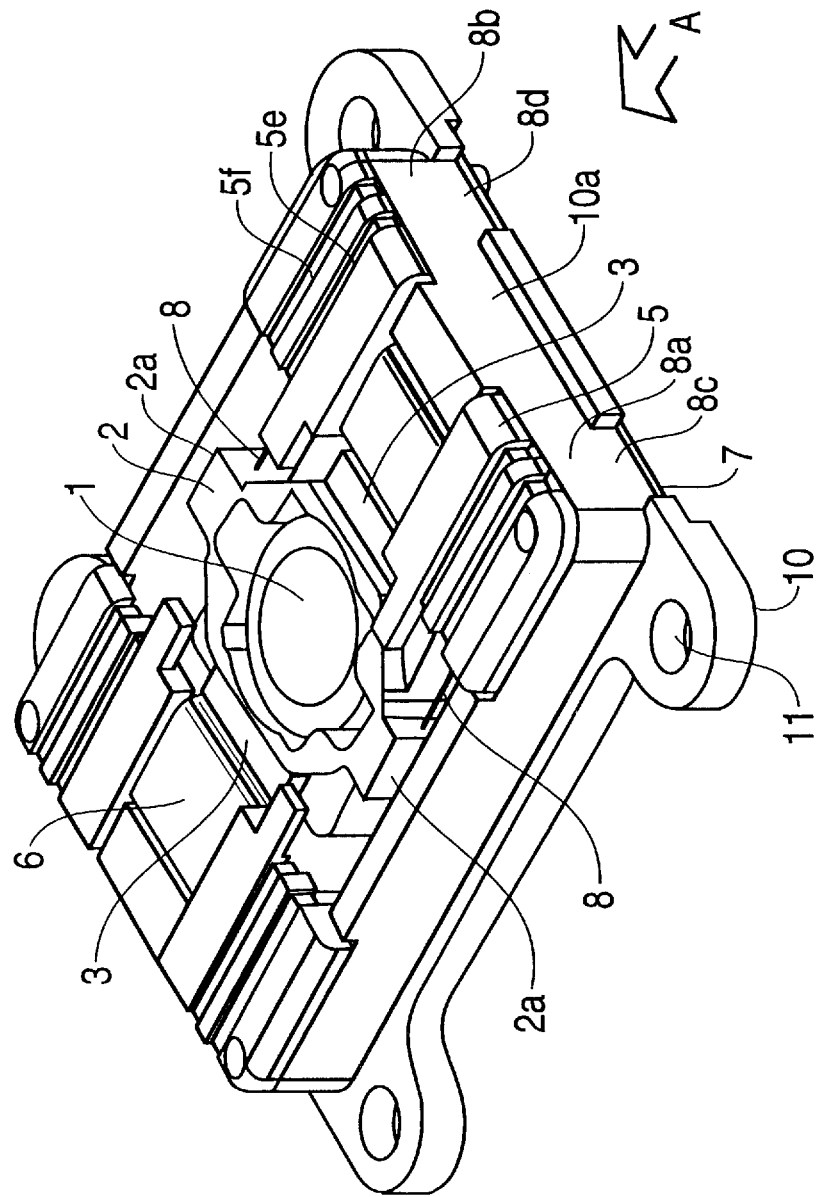
FIG. 1 is a perspective outline view of an objective lens actuator of the invention.
Figure 2:
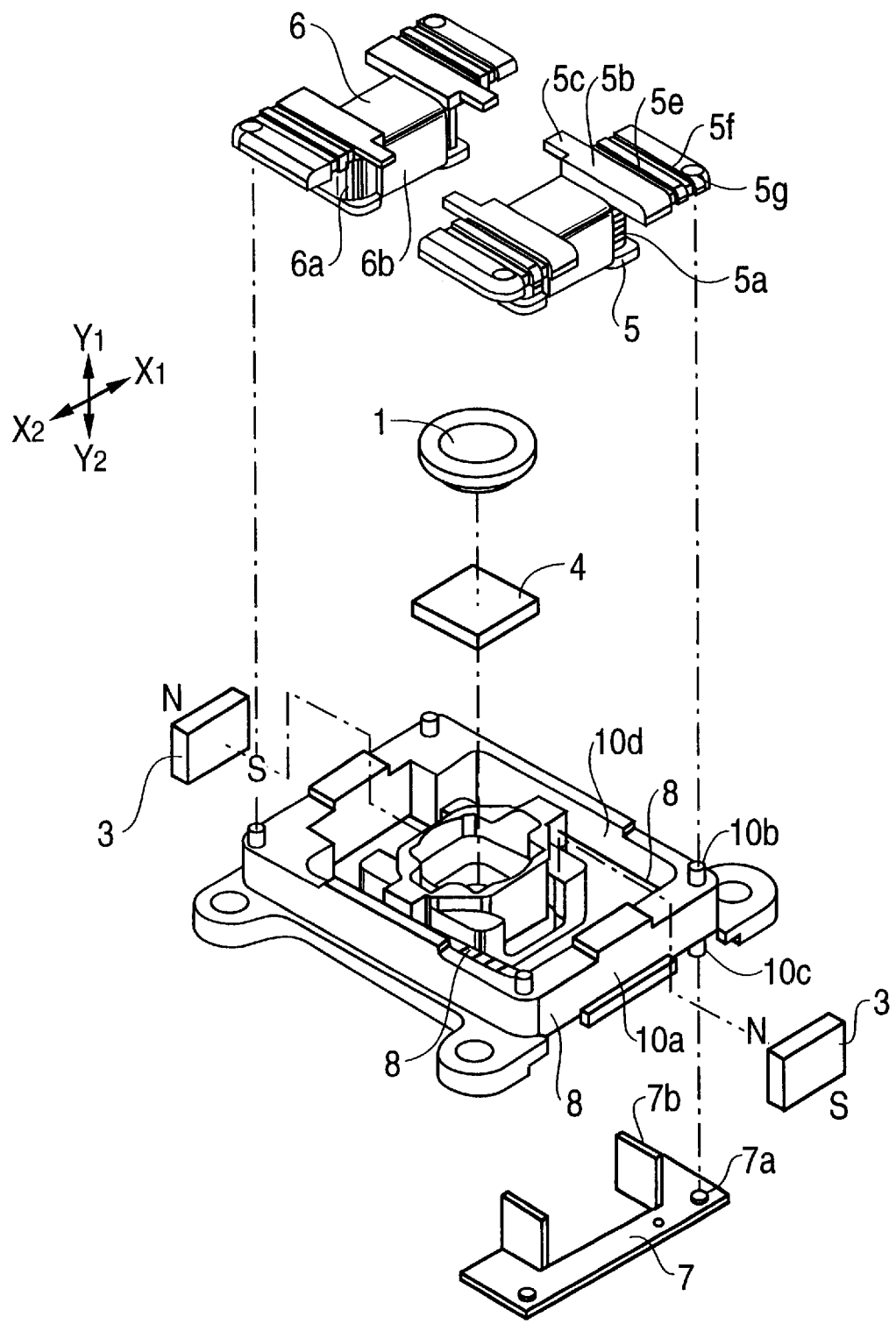
FIG. 2 is a perspective exploded view of the same objective lens actuator.

Referring now to the drawings, a first embodiment of the invention is described in detail below. In FIG. 1 and FIG. 2, an objective lens 1 is adhered to the upper surface in the drawing of a lens holding member 2 formed of a synthetic resin, and an optical plate 4 is adhered to the lower surface, and in the protruding parts 2a at both sides, front ends of linear spring members 8 of phosphor bronze or stainless steel of wire diameter of about 100 microns are formed and fixed by molding. At other sides 90 degrees apart each from the protruding parts 2a, two magnets 3 magnetized in the N-S direction are adhered or fixed by molding as shown in the drawing. At one side wall 10a above a frame-shaped housing 10 which is a fixing member made of synthetic resin, the other ends of the linear spring members 8 are molded and fixed at four fixing points 8a to 8d. Mounting holes 11 are properly provided.

In a coil frame 5 formed of synthetic resin, a winding part 5a is disposed in the middle, and covering parts 5b having a protrusion 5c at one end are provided at both ends above, two wiring arrangement grooves 5e, 5f are provided at both outer sides, and there are positioning fixing holes 5g at both lower ends for firmly fitting and fixing to the positioning pins 10b projecting in four corners of the housing 10. In the winding part 5a, an electromagnetic coil 6 is formed on a winding 6a having the axis of arrow Y1-Y2, with a winding 6b overlaid on the axis of arrow X1-X2. The start and end of each winding is wound several times in the wiring arrangement grooves 5e, 5f, and soldered and fixed to the outside edge of the wound wire. In this portion, for example, a flexible printed board contacts, and is soldered, and a signal current is given to the electromagnetic coil 6. In this case, instead of soldering, any desired electric connection method may be employed.

A brake member holding frame 7 made of transparent synthetic resin has positioning fixing holes 7a provided at both ends for firmly fitting and fixing to the positioning pins 10c projecting at two positions beneath the housing 10, and two partition walls 7b are provided inward.

Concerning thus constituted objective lens actuator of the embodiment, its assembling method is described below. The other end of the linear spring member 8 molded and fixed to the protrusions 2a at both sides of the lens holding member 2 is molded and fixed to one side wall 10a of the housing 10, and the lens holding member 2 is cantilevered by four linear spring members 8. Two coil frames 5 mounting the coil 6 from above the housing 10 are symmetrically press-fitted into the positioning fixing holes 5g by matching with the positioning fixing pins 10b of the housing 10.

Lead wires 6c at the start and end of winding of winding 6a of the coil frame 5 are soldered and fixed to the edge portion 6d where they are wound several times each in the wiring arrangement grooves 5e, 5f. In this portion, the flexible printed board 12 contacts as shown in FIG. 22, and by soldering the terminal pattern 12b and through-hole processing part 12e of the print pattern 12a with edge portion 6d, the other end is connected electrically with the print pattern 12a of the flexible printed board 12 connected with an electric circuit not shown, and a signal current is given to the electromagnetic coil 6. Accordingly, when forming the coil frame 5 by synthetic resin, a synthetic resin material having heat resistance over the solder fusion temperature is needed. A partial modification of the coil frame 5 is shown in FIG. 22(b), in which a shallow groove 5i is formed in the groove by forming a particularly shallow end in the sectional view of the wiring arrangement groove 5e or 5f in FIG. 22(a), and hence the surface of the wound lead wire 6c projects slightly from the coil frame 5. As a result, since the flexible printed board 12 is thin, an electric connection is achieved sufficiently by the built-up solder 12f without requiring through-hole processing part 12e.

Herein, the wiring arrangement groove 5e or 5f is made shallow at an end the coil frame 5, but, instead, a shallow groove may be formed in the bottom of the wiring arrangement groove 5e or 5f on the top surface 5d in FIG. 22(a) so that the lead wire may be partly flush with the surface or project slightly, and the flexible printed board 12 may be soldered by fitting the covering part 5b parallel from above. It is shown to solder at the end portion of the flexible printed board 12, but a hole for soldering may be provided in the flexible printed board 12.

Consequently, the brake member holding frame 7 is pressed-fitted from beneath into the positioning fixing hole 7a by matching with the positioning fixing pin 10c of the housing 10. This brake member holding frame 7 and its partition wall 7b compose, at the fixed position, a recess space enclosing two linear spring members 8 each from the side, together with the inner wall 10d of the housing 10 and the covering part 5b of the coil frame 5, and by injecting liquid into the recess, such as brake member 9 (FIG. 24) having ultraviolet setting properly mainly composed of silicone, and by emitting ultraviolet rays from beneath the transparent brake member holding frame 7 to form a gel, so that an optimum brake effect is obtained against vibration when linear spring members 8 support the lens holding member 2. This brake member may be, aside from gel, other viscoelastic form such as rubber and elastomer.

In thus constituted objective lens actuator in the first embodiment, the operation is described below. When a current flows in two windings 6a, 6b, that is, the electromagnetic coil 6 having an axis on arrow X1-X2, and having an axis on arrow Y1-Y2, an electromagnetic force is built up between the magnets 3 magnetized in the N-S direction spaced oppositely and the electromagnetic coil 6, and hence driving forces in the X1-X2 and Y1-Y2 directions are generated in the magnets 3 fixed on the lens holding member 2, thereby driving the lens holding member 2 cantilevered by the linear spring members 8, hence the objective lens 1 fixed thereon, in the X1-X2 and Y1-Y2 directions. At this time, the brake member 9 gives an optimum brake effect to the vibrating linear spring members 8 which support the lens holding member 2, thereby suppressing low the amplitude of primary resonance.

As a result, the focal position of the laser beam focused on the disk, not shown, above in the diagram to the objective lens through the objective lens 1 can be moved by tracing the track, and the information signal is recorded and reproduced by following up the runout in the plane direction of the disk or eccentricity in the radial direction.

Meanwhile, fixing of the housing 10 and coil frame 5 or brake member holding frame 7 may be achieved, aside from the method shown above, by exchanging the corresponding positioning pins and positioning fixing holes, and press-fitting may be replaced by adhesion or fixing by ultrasonic fusion by installing position defining members mutually. Although not shown, if necessary, a cover corresponding to the cover 46 in the prior art in FIG. 14 may be used, but, as shown in FIG. 21, a large area is covered by the covering part 5b and protrusion 5c of the coil frame 5, and this covering area is further increased by forming an expanded part 5h, and hence dust hardly gets in without using cover 46.

Incidentally, the protrusion 5c and expanding part 5h are used not only as cover, but also act to limit the range of motion when the lens holding member 2 is forced to swing widely due to a strong current flowing in the electromagnetic coil 6 as a result of some strong external vibration or impact or other cause.

The parts of the embodiments may be executed independently or the parts of the embodiments may be combined properly, or also combined with the prior art.

Figure 4:
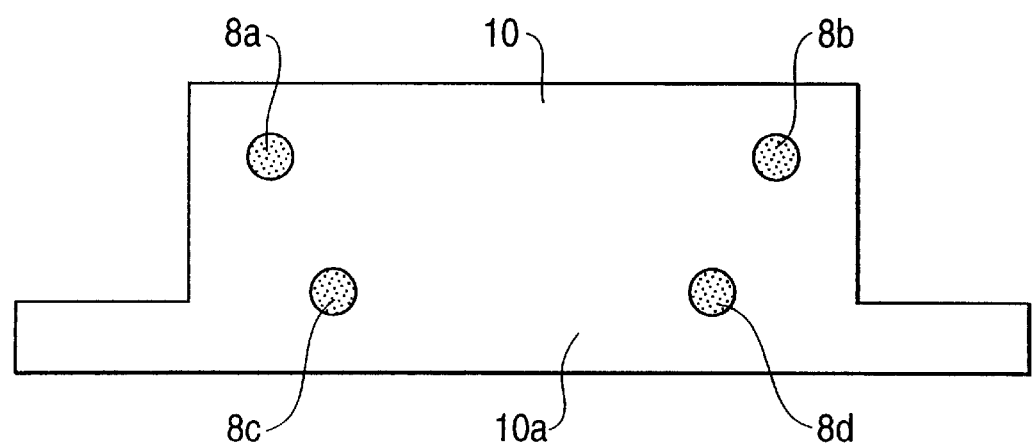
FIG. 4 is a front view of the housing 10 seen from arrow B in FIG. 3.

A fundamental first embodiment of the invention is described so far, and in execution of the embodiment, specific details are further described below. FIG. 3 is a plan view of the lens holding member 2 cantilevered by the linear spring members 8 in a housing 10 in a second embodiment of the invention, and FIG. 4 is a front view of the housing 10 as seen from direction of arrow B in FIG. 3. In the diagram, it is emphasized that the interval of a lower pair is narrower than the interval of an upper pair of the linear spring members 8.

Figure 5A:
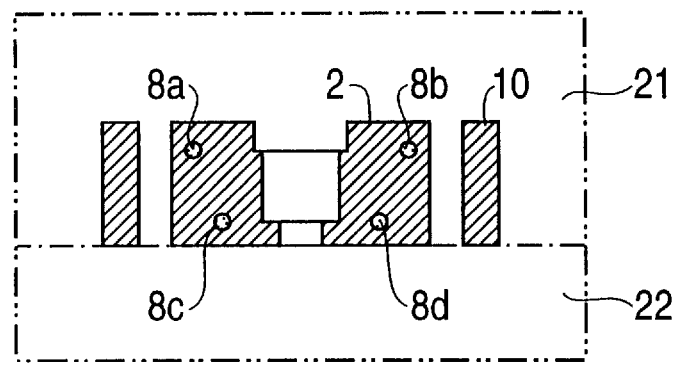
Figure 5B:
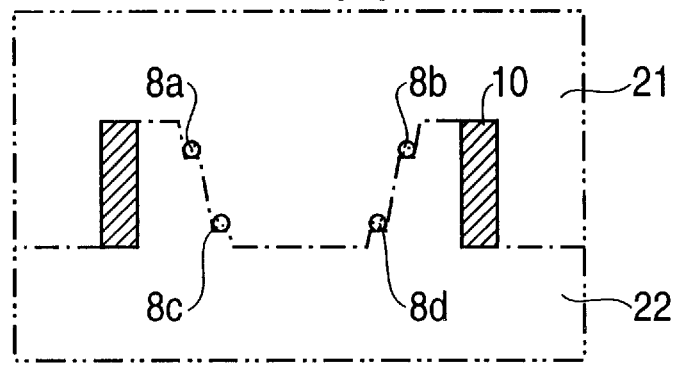
Figure 5C:
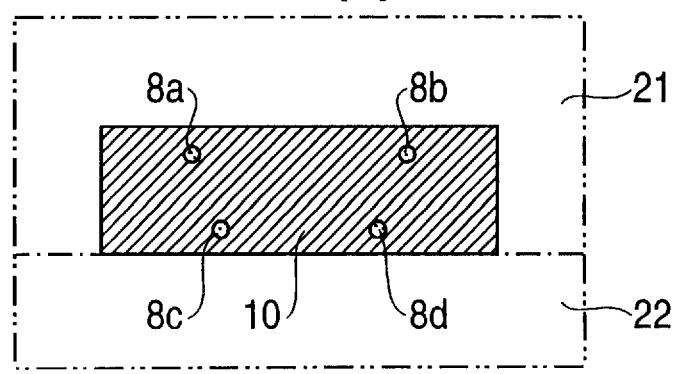

FIG. 5 is a sectional view of a die for forming the part shown in FIG. 3 by injection molding, FIG. 5(a) shows a die section in section B1-B2 in FIG. 3, FIG. 5(b) in section C1-C2, and FIG. 5(c) in section D1-D2. In this way, the linear spring members 8 are firmly held by an upper die 21 and a lower die 22 of the die, and the fused forming material is injected; otherwise the thin linear spring members 8 are bent in the process of forming. In FIG. 5, the lower linear spring members 8b and 8d are slightly shifted inside of the upper linear spring members 8a and 8c. If arranged at the same intervals in the top and bottom, the side cores must be used, instead of the simple die divided into upper and lower halves as in FIG. 5, and the die structure is complicated, and the die fabrication time and cost are increased. To avoid this, it is the object to simplify the die structure. In the diagram, the shaded area corresponds to the lens holding member 2 and housing 10.

Figure 6A:
Figure 6B:
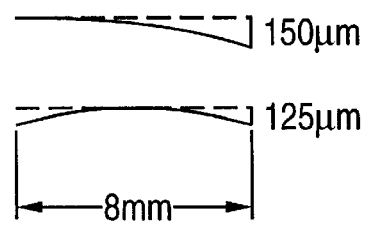
Figure 6C:
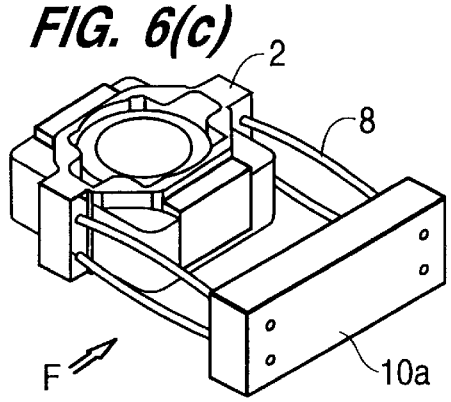
Figure 6D:
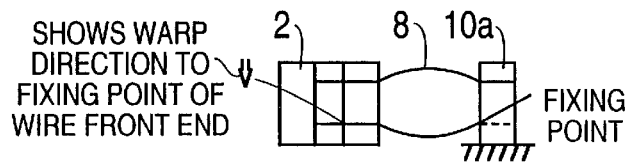
Figure 6E:
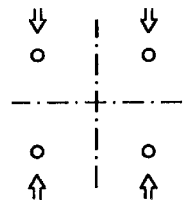
Figure 6F:
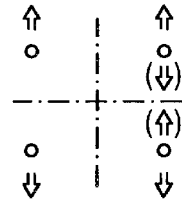
Figure 6G:
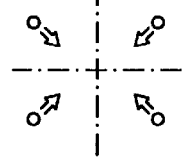
Figure 6H:
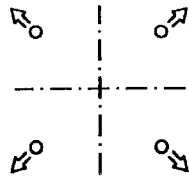
Figure 6I:
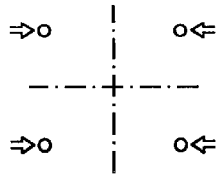
Figure 6J:
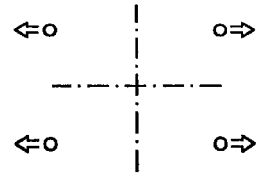

Shown below is an example of solving a manufacturing problem and leading to enhancement of performance. FIG. 6 is an explanatory diagram of means for solving bending of the linear spring members 8. The material of the linear spring members 8 is delivered as a hoop material wound in a reel as shown in FIG. 6(a). Therefore it is slightly curly, and when assembled into the objective lens actuator, supposing the length of the exposed portion to be 8 mm, a curvature as shown in FIG. 6(b) is formed. This is shown in the perspective view in FIG. 6(c), and a view from arrow F in FIG. 6(c) is shown in FIG. 6(d). When the curvature direction in FIG. 6(d) is indicated by the leftward arrow in the diagram as the curvature direction of the front end relative to the fixing point, the curvature directions of the four linear spring members 8 are as shown in FIG. 6(e) to FIG. 6(j), that is, for example, in FIG. 6(e), two pieces at the left side are curved inward at the front ends, and the two pieces at the right side are same. FIG. 6(f) shows a combination in opposite direction, FIGS. 6(g), (h) show point symmetrical combinations, and FIGS. 6(i), (j) are mutually confronting combinations in the lateral direction. By combining so that the vertical, lateral or diagonal linear spring members 8 may confront each other or depart from each other in the curvature direction, that is, the curvature directions may be mutually opposite, the lens holding member 2 is prevented from being curved and fixed at one side relative to the fixing point, or being twisted in the direction of vibration. Although not very preferable, as indicated in parentheses in FIG. 6(f), two pieces at the right may confront inward mutually, oppositely to the left side. Including such combinations, many combinations are possible.

When determining the directivity of the linear spring members 8 as shown in FIG. 6, assembling is practically difficult if the wire section is round. Accordingly, the hoop material delivered in a reel form as shown in FIG. 6(a) is rolled from top and bottom as shown in FIG. 7(a) to be formed into a section as shown in FIG. 7(b). By further processing, it may be formed into a section shown in FIG. 7(c) and reeled as in FIG. 7(d). Then, the material first as shown in FIG. 7(e) is formed as shown in FIG. 7(f), and the curvature direction is orthogonal to the longitudinal direction of the section, and the direction can be determined in the die when determining the curvature direction as shown in FIG. 6(e) or FIG. 6(j), and wire deflection hardly occurs as compared with the round section, among other excellent features. This processing may be done by using a press, but since processing is intermittent, it is better to roll between two rolls, or it may be also processed by wire drawing by passing through one or plural dies.

Figure 8A:
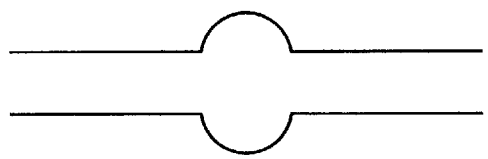
Figure 8B:
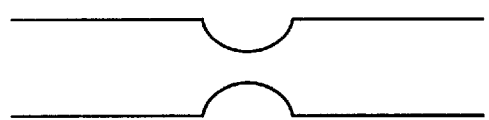
Figure 8C:
Figure 8D:
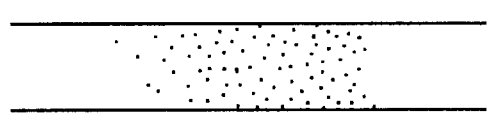

Next is discussed the slip-out strength in the case of insert forming the linear spring member 8 in the lens holding member 2 or housing 10. The wire material is usually formed into a thin wire by drawing, and hence the surface is generally smooth. When insert formed directly in this state, the pull-out strength is weak, and it may slip out by a slight force due to shrinkage or other changes of the formed piece, which may cause to change the position of the lens holding member 2. As a countermeasure, a protrusion is formed partially as shown in FIG. 8(a). It is made, for example, by soldering. A recess is formed by a press in FIG. 8(b). By forming a recess, it does not matter if swollen in the 90-degree direction. Or, as shown in FIG. 8(c), the entire surface or a specific surface may be knurled. The surface may be roughened by sand blasting or etching as shown in FIG. 8(d). Such processing may be done only in the inserting portion, or may be done continuously or intermittently over the entire length if positioning is difficult.

Figure 9A:
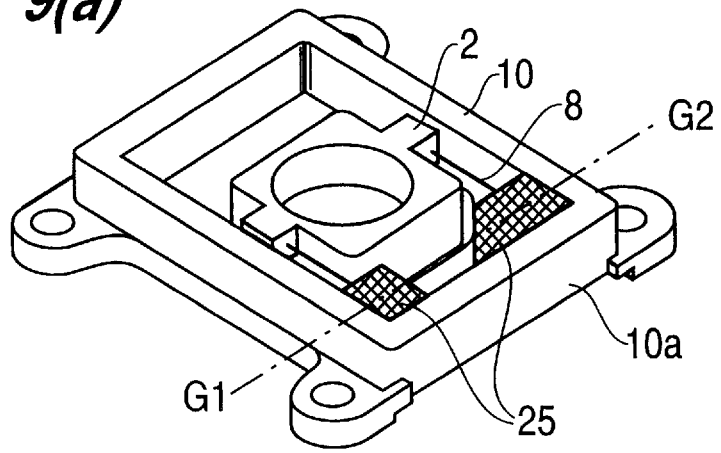
Figure 9B:
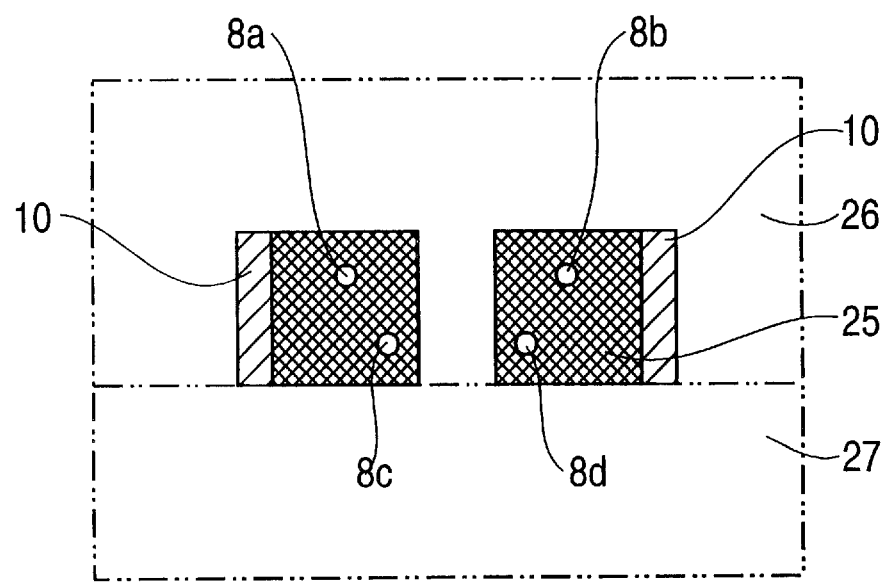

Other means not using the brake member holding frame 7 in FIG. 2 is explained below. FIG. 9(a) shows forming of a viscoelastic material 25 by secondary forming in contact with a side wall 10a as the fixing point of linear spring member 8 of the housing 10, instead of forming the brake frame holding frame 7 in FIG. 2 for damping of the linear spring members 8. FIG. 9(b) shows a die structure in section G1-G2 in FIG. 9(a). Thus, instead of the addition of parts or process of liquid injection and solidification, the brake member can be formed by secondary forming.

A third embodiment of the invention is described below. The third embodiment relates to an improvement of manufacturing method. In FIG. 10, a linear spring member 8 penetrates through the lens holding member 2, and further penetrates through the side wall 10d confronting the side wall 10a for holding the original fixing point of the linear spring member 8 in the housing 10. When the length of the linear spring member 8 is adjusted to the length of the housing 10 or slightly shorter, it will not project out of the housing 10. By so forming, positioning of the linear spring member 8 in the dies 21, 22 in FIG. 5 is easy, and the relative position of the formed parts may be kept at high precision. However, in part 8e in FIG. 10, if the linear spring member is left over, and the lens holding member cannot be cantilevered, and this portion and outside unnecessary part should be cut off by the die, or burnt off by laser beam. This section may be as shown in FIG. 10, but when cut in this state, it is likely to be deformed in the subsequent assembling work and assembling is difficult, and therefore, preferably, after assembling into the state in FIG. 1, the portion 8f in FIG. 10 should be cut off by laser process or the like, so that deformation hardly occurs during assembling work, thereby making the assembly easy.

The state shown in FIG. 10 may be formed individually, but to further enhance the processing efficiency, a continuous forming process as shown in FIG. 11 may be considered. In FIG. 11, a material 8g of linear spring member processed as shown, for example, in FIG. 7 is wound on a reel 26, and the direction of warp at this time is considered as explained in FIG. 6. Slip-out preventive process is done as shown in FIG. 8 by using a forming press 28 through a roller 27. Not limited to a press, other slip-out preventive method may be employed. Consequently, it is injected continuously by using dies 21, 22 in an injection molding machine 29. A completed piece is taken up on a take-up reel 30, and is separated in other process.

If the material of the reel 26 has been already processed to prevent from slipping out as shown in FIG. 8, the forming press 28 is not needed. Or, when a roll processing machine is installed before the forming press 28, the material of the reel 26 may be a blank material without any prior processing. Instead of winding on the reel 30, when the linear spring member is cut off, the brake member is injected and solidified after assembling the electromagnetic coil 6 and brake member holding frame 7, and the linear spring member is cut off, continuously throughout, a perfect continuous automatic processing is realized.

So far is explained the processing and assembling method by mold forming of the housing 10 and lens holding member 2 through linear spring members 8, but instead of the mold forming, by explaining the portion of the lens holding member 2, for example, as shown in FIG. 12, the lens holding member is divided into a central part 2b, and upper and lower parts 2c, 2d, and when these three pieces are adhered together with the linear spring member 8, or fused ultrasonically, a similar product can be obtained. In the illustrated example, the housing 10 and lens holding member 2 are divided into upper and lower parts, but it is also possible to divide into right and left parts.

A fourth embodiment of the invention is described. FIG. 16 is a side view of a lens holding member which is a lens holding member in the objective lens actuator in the fourth embodiment of the invention, and FIG. 17 is an explanatory diagram showing the moment balance in this lens holding member. In FIG. 16, in the upper middle part of the lens holding member 2, an objective lens 1 is firmly fixed by adhesion or the like, and an optical plate 4 of a nearly quadrangular form is firmly fixed by adhesion or the like in the lower middle part of the lens holding member 2. The optical plate 4 may be a transparent glass plate, or, depending on the application of the objective lens actuator, may be a laminate of a hologram plate 4a and a quarter wavelength phase plate 4b. At the right and left side of the lens holding member 2, linear spring members 39a, 39b symmetrical to the objective lens optical axis are planted in the upper part, and similarly linear spring members 39c, 39d symmetrical to the objective lens optical axis are planted in the lower part.

The condition for determining the position of the linear spring members is discussed herein. In FIG. 17, for the sake of simplicity, the holding center in the vertical direction in the drawing of the linear spring members 39a, 39b, 39c, 39d is supposed to coincide with the center of the driving force created by the electromagnetic coil on the X1-X2 axis and the magnets 3. Supposing the mass m1 of the objective lens 1 to be located at its center of gravity G1, the mass m2 of the optical plate 4 at its center of gravity G2, the distance from the driving center to G1 to be L1, and the distance to G2 to be L2, when the relation of $$L1 \times m1 = L2 \times m2$$

is established, the moment is balanced. It is assumed, however, that the moment is balanced in the objective lens 1, and the lens holding member and others except for the balance weight 45.

In the example shown in FIG. 17, the objective lens 1 has m1=83 mg, and the optical plate 4 has m2=74 mg, and therefore the L1 and L2 must be in reverse ratio, but if this relation is not established, it may be satisfied by adding an extra weight 50 as shown in FIG. 16.

Explaining the operation in such constitution, the lens holding member 2 cantilevered by the linear spring members 39a, 39b, 39c, 39d is in the suspension vertical center, and this center is balanced in the moment as mentioned above when a driving force by the electromagnetic coil 36 and magnets 3 is applied in the direction of arrow F to the central position C balanced also in moment, and therefore rotary moment in the clockwise and counterclockwise direction is not created with respect to the central position C, and the undesired resonance indicated by broken line near the primary resonance frequency f1 in FIG. 18 which was a problem in the prior art is removed, and the upper end of the lens holding member 2 is integrated with the objective lens 1, and the lower end is integrated with the optical plate 4, so that a rigid nearly hexahedral box shape is formed excluding the protruding part for holding the linear spring member 39. Accordingly, distortion due to vibration as in the prior art shown in FIG. 20 hardly occurs, the frequency of secondary resonance is higher, and the amplitude of the secondary resonance is small, and the control gain is high, so that it is possible to follow up the disk eccentricity with a smaller error.

In driving of the lens holding member 2 in the direction of arrow Y1-Y2, that is, corresponding to runout of the disk, primary resonance and secondary resonance appear as shown in FIG. 18, but it is easier to arrange in good balance as compared with the direction of arrow X1-X2, and undesired resonance does not matter much, and as for the secondary resonance, in the constitution of the prior art, complicated distortion is caused also in other direction to lower the secondary resonance frequency and increase the amplitude, but this problem can be solved at the same time in the constitution shown in FIG. 1. Moreover, as shown in FIG. 28, by matching the terminal position of the lens holding member 2 side of the linear spring member 39 with the center line in the X1-X2 direction of the objective lens 1, undesired resonance may be further decreased, and a stabler action is obtained.

Thus, according to the fourth embodiment, undesired resonance is suppressed by matching the holding center in the vertical direction of the objective lens holding member held by the linear spring members with the center of driving force created by the electromagnetic coil on the X1-X2 axial and the magnets 3, and equalizing the product of the mass of the objective lens 1 and the distance to the driving center and the product of the mass of the optical plate 4 and the distance to the driving center, and moreover the upper end of the objective lens holding member 2 is integrated with the objective lens 1, and the lower end with the optical plate 4 to form a rigid nearly hexahedral box, and thereby the secondary resonance frequency is heightened and the amplitude is decreased, and hence a negative feedback combining the electrical and mechanical systems is applied powerfully, so that the objective lens 1 can be followed up accurately in spite of the disk runout and eccentricity.

In the foregoing embodiments, the objective lens holding member conforms to the conventional structure fixing the magnets, but the operation is also possible by inverting the mounting positions of the magnets 3 and electromagnetic coil 36.

A fifth embodiment of the invention is described below. FIG. 26 shows a partial perspective view of the brake unit, which is based on the prior art shown in FIG. 19, improved only in the brake unit. An integral recess 37b is formed around the linear spring member 39 of the fixing member 37a, and a brake member 37c is integrally injected into the recess 37b. As a result, labor of injecting into tiny holes as in FIG. 19 is avoided, and since the recess 37b is wide, it is easy to inject, and the productivity is enhanced.

A sixth embodiment of the invention is described below. FIG. 27 shows a processing example of its essential linear spring. This embodiment may be executed in addition to the first embodiment in FIG. 25, the fifth embodiment in FIG. 26, or the prior art in FIG. 19. What is shown in FIG. 27(a) is applied to the prior art in FIG. 19, in which an expanded section 39a is provided in the sealing portion of brake member 37e of the linear spring member 39, and the resistance to the brake member 37e is increased. In FIG. 27(b), soldering is applied; in FIG. 27(c), a protruding form is provided by a press or the like; and in FIG. 27(d), a flat surface is partly formed by a press or the like. Accordingly, the desired object of suppressing the primary resonance can be effectively done. In FIG. 28(a), although the job efficiency is not improved, when applied in FIG. 24 or FIG. 26, further effects are expected aside from the improvement of the job efficiency.

FIG. 25 shows an example of controlling vibration by using a brake member, in which the first linear spring member 8a fixed at a side wall 10a for holding the fixing point of the housing 10 penetrates through the lens holding member 2 to form a second linear spring member 8b, and it further confronts a third linear spring member 8c planted from a side wall 10d opposite to the side wall 10a for holding the linear spring member 8a in the housing 10, across a confronting part 8d in a small space, and a viscoelastic member 12 is held on this confronting part 8d. In this case, the linear spring member 8a is stretched by passing from the side wall 10a to the side wall 10d, and it is burnt off at point 8d by means of a die or laser beam. Instead of such manufacturing method, the linear spring member 8a and second and third linear spring members 8b, 8c in other parts may be other things, and different in number.

The viscoelastic element provided in the confronting part 8d may be an uncured viscoelastic element which may be adhered and cured, or may be formed by secondary forming by using a die.

The foregoing embodiments relate to the cantilever structure of the lens holding member by using four linear spring members, but not limited to this, and it can be applied in various cases.

Effects of the Invention

As described herein, according to the objective lens actuator of the invention, a principal constitution comprises a lens holding member for holding an objective lens, plural linear spring members for supporting the lens holding member, and a fixing member for fixing the linear spring members, in which the lens holding member, linear spring members and fixing member are formed integrally by molding, or instead of molding, the constitution may also comprise a lens holding member for holding an objective lens being divided into a plurality, plural linear spring members for supporting the lens holding members, and a fixing member for fixing the liner spring members being divided into a plurality, in which the linear spring members are held and fixed by the plurality of lens holding members and the plurality of fixing members, thereby forming into one body.

A manufacturing method of the objective lens actuator of the invention comprises the steps of forming frame-shaped fixing member for fixing plural linear spring members at two points respectively and lens holding members not contacting with the fixing members in the frame of the fixing members, and cutting off all of one side of the lens holding members of the linear spring members and fixing members thereafter or after assembling necessary accessories, thereby supporting the lens holding members at one side, and still more, the frame-shaped fixing members for fixing continuous plural linear spring members at two points, and the lens holding members not contacting with the fixing members in the frame of the fixing members may be formed consecutively, and in this method, hence, the lens holding member and fixing members can be formed by mold forming.

Accordingly, the mounting precision of the lens holding member mounted on the frame-shaped fixing member through the linear spring members may be enhanced, and the mounting strength is increased. Moreover, by defining the mounting interval of the linear spring members or their curvature direction, distortion or runout of the linear spring members hardly occurs, and the lens holding member, that is, the position of the objective lens held by it is stable, and the motion precision is enhanced.

By such constitution and manufacturing method of the invention, the number of parts is decreased significantly, difficult manual job such as insertion of linear spring into tiny hole or soldering as in the prior art is eliminated, and continuous forming is enabled, and hence fixing of linear spring for assuring parallel motion of lens holding member is easy, and the mounting precision and mounting strength are enhanced, while the cost is reduced and the manufacturing efficiency is improved.

In the objective lens actuator of the invention, the objective lens holding part is integrated with the objective lens and optical plate, and a rigid nearly hexahedral box is formed, in which the holding center in the vertical direction of the objective lens holding member held by the linear spring members and the center of driving force created by the electromagnetic coil and magnets 3 are matched, and it is arranged so that the moment as the product of the mass of the objective lens and the distance to the driving center and the moment as the product of the mass of the optical plate or sum of it and extra weight being added as required and the distance to the driving center are equal to each other, and thereby the undesired resonance is suppressed, the secondary resonance frequency is heightened and its amplitude is reduced to heighten the control gain, and a negative feedback combining the electric and mechanical systems is powerfully applied, so that focus control and tracking control can be done accurately following up the changes of disk runout and eccentricity.

According to the objective lens actuator of the invention, plural wiring arrangement grooves are provided for winding the lead wires at the start and end of winding of the coil of the winding part in the covering part for covering the inside by linking with the winding part of the coil frame, and the lead wires wound in part of the wiring arrangement grooves are soldered, and a flexible printed board having a corresponding conductive foil is abutted against the soldering part to solder, so that the number of soldering positions is decreased, while defective soldering may decreased.

The coil frame has a positioning fixing part, and this positioning fixing part supports the plural linear spring members on one side, and only by mounting the linear spring members on the fixing member for fixing at the other end, they can be positioned spontaneously, and along with the improvement of the soldering method, the coil frame, or the coil position can be mounted easily and accurately at the relative position to the lens holding member holding the magnets, that is, the magnets, and the objective lens can be driven accurately electromagnetically, and the movable range of the lens holding member can be defined and the invasion of dust can be prevented by the coil frame.

Also according to the objective lens actuator of the invention, the brake effect on the primary resonance can be enhanced by this magnified section in the constitution comprising the magnified section partially in the injecting portion of the viscoelastic material in the linear springs.

The brake member can be injected easily in the constitution comprising the casing by batch injection of a viscoelastic material into a recess having a plurality of linear spring members planted therein, or in the constitution comprising a brake member holding frame for injecting brake member of viscoelastic material in a recess by forming a recess space enclosing linear springs from the sides by the plane part, partition wall, fixed side wall of the fixing member, its adjacent side wall, and coil frame, and also in the constitution comprising the viscoelastic member formed by including the confronting part of the second linear spring and third linear spring, the brake member can be formed easily, and hence the cost is reduced and the manufacturing efficiency can be enhanced.

We claim:

1. An objective lens actuator comprising,
    a lens holding member for holding an objective lens,
    plural linear spring members for supporting the lens holding member, and
    a fixing member for fixing the linear spring members,
    wherein the lens holding member, linear spring members and fixing member are integrally formed by molding.

2. An objective lens actuator comprising,
    a lens holding member divided into a plurality of lens holding members for holding an objective lens,
    plural linear spring members for supporting the lens holding members, and
    a fixing member divided into a plurality of fixing members for fixing the linear spring members,
    wherein the linear spring members are held and fixed and formed into one body by the plurality of lens holding members and the plurality of fixing members.

3. The objective lens actuator of claim 1 or 2,
    wherein the fixing member is shaped like a frame, and is capable of fixing and holding and positioning a coil frame winding having a pair of electromagnetic coils.

4. The objective lens actuator of claim 3,
    wherein the coil frame has two orthogonal coils overlaid and wound in an axial direction, and
    wherein wiring arrangement grooves for winding the start and end of wiring of coil winding between the fixing member and fixing part are provided at both ends of a coil winding part.

5. The objective lens actuator of claim 3,
    wherein a recess having a partition wall and enclosing the linear spring members with a side wall of the fixing member and the coil frame is formed, and
    wherein a brake member holding frame for injecting a brake member of gel form or viscoelastic form into the recess is affixed to the fixing member.

6. The objective lens actuator of claim 3,
    wherein a viscoelastic material for enclosing a linear spring by secondary forming is formed adjacently to a side wall of the portion for fixing the linear spring of the fixing member.

7. The objective lens actuator of claim 1 or 2,
    wherein a pair of magnets are fixed on the lens holding member by adhering or molding.

8. The objective lens actuator of claim 7,
    wherein the linear spring members have at least two mutually parallel planes.

9. The objective lens actuator of claim 1 or 2,
    wherein linear spring members are disposed on upper and lower pairs of parallel lines, each line being parallel to each other line, and
    wherein the interval of a pair of linear spring members disposed on one pair of parallel lines and the interval of another pair of linear spring members on another pair of parallel lines are different from each other.

10. The objective lens actuator of claim 1 or 2,
    wherein each linear spring member is slightly curved, and
    wherein vertical, lateral, and diagonal confronting linear spring members disposed mutually at a confronting spacing are mutually reverse in a curvature direction.

11. The objective lens actuator of claim 1,
    wherein a protruding shape, a dent shape or a rough surface is formed in at least an injecting portion of the lens holding member or fixing member of a linear spring member.

12. A method of manufacturing an objective lens actuator, comprising the steps of:
    forming frame-shaped fixing members for fixing plural linear spring members at two points respectively and lens holding members not contacting the fixing members in the frame of the fixing members, and
    cutting off all of one side of the lens holding members of the linear spring members and fixing members thereafter or after assembling necessary accessories,
    thereby supporting the lens holding members at one side.

13. A method of manufacturing an objective lens actuator, comprising the steps of:
    continuously forming frame-shaped fixing members and lens holding members, and
    supporting each of the lens holding members within a frame of each of the frame-shaped fixing members continuously through consecutive plural linear spring members.

14. The manufacturing method of claim 12 or 13,
    wherein each of the lens holding members and each of the frame-shaped fixing members are formed by molding.

15. The manufacturing method of claim 14,
    wherein magnets are simultaneously molded on each of the lens holding members.

16. The manufacturing method of claim 13,
    wherein one side of each of the linear spring members is cut off, and
    wherein each of the lens holding members is supported at one side of a frame of each of the frame-shaped fixing members.

17. The manufacturing method of objective lens actuator of claim 13,
    wherein unnecessary parts of each of the linear spring members are removed.

18. An objective lens actuator comprising,
    a lens holding member for holding an objective lens,
    plural linear spring members for supporting the lens holding member,
    a fixing member for fixing the linear spring members, and
    a coil frame having a positioning fixing part confronting the fixing member, being linked to a winding part for overlaying and winding two orthogonal coils in an axial direction.

19. The objective lens actuator of claim 18,
    wherein the coil frame has a projection or an expanding part for defining a movable range of the lens holding member.

20. An objective lens actuator of claim 18, wherein the coil frame having an expanding part, a frame-shaped fixing member, and the lens holding member are combined to form a nearly box-shaped structure.

21. An objective lens actuator comprising, a lens holding member for holding an objective lens, plural linear spring members for supporting the lens holding member, a fixing member for cantilevering the linear spring members, and a casing in a side of the fixing member for receiving a viscoelastic material in a batch for enclosing a part of the plural linear spring members.

22. An objective lens actuator comprising, a lens holding member for holding an objective lens, plural linear spring members for supporting the lens holding member, a fixing member having a fixing side wall for cantilevering the linear spring members and an adjacent side wall, a coil frame for winding an electromagnetic coil, a brake member holding frame having a flat part and a partition wall for making a recess space by enclosing the linear spring members with the flat part, partition wall, fixing side wall of the fixing member, its adjacent side wall and coil frame from the side, and an injected brake member of viscoelastic material in said recess.

23. The objective lens actuator of claim 21 or 22, wherein the linear spring members are provided with an expanding sectional part covered by the viscoelastic material.

24. An objective lens actuator comprising, a lens holding member for holding an objective lens, plural linear spring members for supporting the lens holding member, a fixing member for cantilevering the linear spring members, and a recess for enclosing the linear spring members provided around a fixing point of the plurality of the linear spring members of the fixing member, wherein a viscoelastic material is injected into the recess, and wherein an expanded section is provided in a portion of the linear spring members in the recess infected with the viscoelastic material.

25. An objective lens actuator comprising, a lens holding member of a nearly hexahedral shape for holding an objective lens, an objective lens mounted on a first plane of said lens holding member, an optical plate mounted on a second plane that is parallel to said first plane of said lens holding member, a driving magnet and an electromagnetic coil mounted on a third plane, and another driving magnet and electromagnetic coil mounted on a fourth plane that is parallel to said third plane, wherein said first plane and said second plane are perpendicular to said third and said fourth plane, and wherein said objective lens and said optical plate are disposed between said third and said fourth plane.

26. An objective lens actuator comprising:

a lens holding member of a nearly hexahedral shape for holding an objective lens;

plural linear spring members for supporting said lens holding member within a frame-shaped fixing member to one side of said frame-shaped fixing member, wherein one end of said lens holding member is fixed to said one side of said frame-shaped fixing member;

an objective lens mounted on a first plane of said lens holding member;

an optical plate mounted on a second plane confronting said first plane of said lens holding member, a driving magnet and electromagnetic coil mounted on a third plane; and another driving magnet and electromagnetic coil mounted on a fourth plane confronting said third plane in an axial direction of the plural linear spring members, wherein the respective confronting first and second planes are parallel to each other, wherein the respective confronting third and fourth planes are parallel to each other, and wherein said axial direction of said plural linear spring members is in the same direction as said first plane and said second plane.

27. The objective lens actuator of claim 26, wherein said linear spring members are positioned relative to said objective lens and said optical plate so that a moment of the objective lens and a moment of the optical plate are equal to each other with respect to a center of a driving force created by a driving magnet and electromagnetic coil.

28. The objective lens actuator of claim 27, wherein extra weight is added to said lens holding member so that the moment of the objective lens is equal to the moment of the optical plate.

29. The objective lens actuator of claim 28, wherein said extra weight is added to said lens holding member to change the moment of the objective lens in making the moment of the objective lens equal to the moment of the optical plate.

30. The objective lens actuator of claim 26, wherein said linear spring members are positioned relative to said objective lens and said optical plate so that a holding center of said linear spring members and a driving force center created by a driving magnet and electromagnetic coil are matched.

31. The objective lens actuator of claim 26, wherein an end of each linear spring member terminates in the lens holding member on a center line of the objective lens.

32. An objective lens actuator comprising, a lens holding member for holding an objective lens, a frame-shaped fixing member, a first plurality of linear spring members, each of the first plurality of linear spring members having one end fixed to one side of said lens holding member and another end fixed to one side of said frame-shaped fixing member, a second plurality of linear spring members, each of the second plurality of linear spring members having one end fixed to another side of said lens holding member, a third plurality of linear spring members, each of the third plurality of linear spring members having one end fixed to another side of said frame-shaped fixing member, and a plurality of viscoelastic members,
wherein another end of a second linear spring member is connected to another end of a third linear spring member by a viscoelastic member of said plurality of viscoelastic members so that each second linear spring member is connected to a third linear spring member via a viscoelastic member,
whereby said one side of said lens holding member is fixed to one side of said frame-shaped fixing member via said first plurality of linear spring members, and
whereby said another side of said lens holding member is fixed to said another side of said frame-shaped fixing member via said second plurality of linear spring members, said third plurality of linear spring members and said plurality of viscoelastic members.

33. The objective lens actuator of claim 32,
wherein a linear spring member of said first plurality of linear spring members is integrally formed with a linear spring member of said second plurality of linear spring members so that each first linear spring member is integrally formed with a second linear spring member.

* * * * *